(12) United States Patent  
Raynor et al.

(10) Patent No.: US 9,565,375 B1  
(45) Date of Patent: Feb. 7, 2017

(54) PIXEL AND AN ARRAY OF PIXELS

(71) Applicants: STMICROELECTRONICS (RESEARCH & DEVELOPMENT) LIMITED, Marlow, Bucks (GB); STMICROELECTRONICS (GRENOBLE 2) SAS, Grenoble (FR)

(72) Inventors: Jeffrey M. Raynor, Edinburgh (GB); Alexandre Balmefrezol, Sassenage (FR); Laurence Stark, Edinburgh (GB)

(73) Assignees: STMICROELECTRONICS (GRENOBLE 2) SAS, Grenoble (FR); STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 0 days.

(21) Appl. No.: 14/930,834

(22) Filed: Nov. 3, 2015

(51) Int. Cl.
| | |
|---|---|
| *H01L 27/148* | (2006.01) |
| *H04N 5/353* | (2011.01) |
| *H04N 5/378* | (2011.01) |
| *H01L 27/146* | (2006.01) |

(52) U.S. Cl.
CPC .......... *H04N 5/353* (2013.01); *H01L 27/1464* (2013.01); *H01L 27/14603* (2013.01); *H01L 27/14643* (2013.01); *H04N 5/378* (2013.01)

(58) Field of Classification Search
CPC ........... H01L 27/1464; H01L 27/14643; H01L 27/14603; H01L 27/1465; H04N 5/378; H04N 5/353

See application file for complete search history.

(56) References Cited

U.S. PATENT DOCUMENTS

| | | | |
|---|---|---|---|
| 6,940,551 B2* | 9/2005 | Merrill | H04N 5/363 348/241 |
| 8,421,134 B2* | 4/2013 | Jeon | H01L 27/14634 257/204 |
| 9,293,496 B2* | 3/2016 | Kashihara | H01L 27/14636 |
| 9,379,149 B2* | 6/2016 | Yamashita | H01L 27/14607 |
| 2007/0045665 A1* | 3/2007 | Park | H01L 27/14623 257/204 |
| 2010/0230579 A1* | 9/2010 | Watanabe | H01L 27/14609 250/208.1 |
| 2010/0238334 A1* | 9/2010 | Takahashi | H01L 27/14632 348/305 |
| 2012/0301070 A1* | 11/2012 | Shimizu | G02F 1/0121 385/2 |
| 2015/0054110 A1* | 2/2015 | Kashihara | H01L 27/14636 257/435 |
| 2015/0201141 A1* | 7/2015 | Petilli | H04N 5/3696 348/301 |

* cited by examiner

*Primary Examiner* — Yosef Gebreyesus  
(74) *Attorney, Agent, or Firm* — Allen, Dyer, Doppelt, Milbrath & Gilchrist, P.A.

(57) ABSTRACT

A pixel has a photodiode configured to be sensitive to light. The pixel is arranged to use back side illumination. The pixel has at least one sample and hold capacitor which is arranged on the side of the photodiode remote from a side on which light impinges. The capacitor overlies at least part of the photodiode.

18 Claims, 30 Drawing Sheets

PIXEL AND AN ARRAY OF PIXELS

FIELD OF THE INVENTION

Some embodiments relate to a pixel structure and an array of pixels.

BACKGROUND

Image sensors using photodiode pixels, for example implemented in CMOS architecture, are known. Such image sensors have many applications. In some applications, an array of pixels may be provided.

SUMMARY

According to an aspect, a is provided pixel which may include a photodiode configured to be sensitive to light and at least one capacitor arranged on a side of the photodiode remote from a side on which light impinges. The at least one capacitor may overlie at least part of the photodiode.

The at least one capacitor may comprise two capacitors arranged side by side.

The at least one capacitor may comprise two capacitors arranged one over the other.

The at least one capacitor may comprise two capacitors configured to share at least one of a plate and a dielectric.

The at least one capacitor may comprise a plurality of metal layers.

The at least one capacitor may comprise one or more of a metal-oxide-metal capacitor, a metal-intermetal dielectric metal capacitor and a metal-insulator-metal capacitor.

The pixel may comprise at least one further capacitor, and the at least one further capacitor may comprise a gate oxide capacitor.

The gate oxide capacitor may comprise a well in a same substrate as a well of the photodiode.

The at least one capacitor may comprise at least two capacitors, and the at least two capacitors may share at least one layer.

The at least one capacitor may comprise a finger capacitor.

A plurality of finger capacitors may be provided in a common layer, and the finger capacitors may comprise a plurality of elongate conductors. The elongate conductors of a respective capacitor may be equally spaced from each other.

The pixel may include a first metal layer including a plurality finger capacitors, an insulating layer and a second metal layer including a second plurality of finger capacitors.

The pixel may be configured to be responsive to back side illumination.

The at least one capacitor may provide a sample and hold function.

The at least one capacitor may be configured to store charge from the photodiode.

At least 80% of an area of a pixel may be covered by the at least one capacitor.

According to another aspect, a pixel array is provided including a plurality of pixels. Each pixel may include a photodiode configured to be sensitive to light and at least one capacitor arranged on a side of the photodiode remote from a side on which light impinges. The at least one capacitor may overlie at least part of the photodiode.

The pixel array may be one of a global shutter pixel array and a rolling blade pixel array.

At least two pixels may be configured such that at least one capacitor of the at least two pixels are configured to have at least one of a common plate and a common dielectric.

Each pixel may comprise a first capacitor and a second capacitor. The first capacitor may be configured to store charge from the photodiode, and the second capacitor may be configured to receive the charge from the first capacitor and to provide an output to a read transistor. The first capacitor of one pixel may be arranged to be adjacent to a second capacitor of an adjacent pixel.

BRIEF DESCRIPTION OF THE DRAWINGS

Reference is now made by way of example only to the accompanying drawings in which.

DETAILED DESCRIPTION OF SOME EMBODIMENTS

Figure 1:
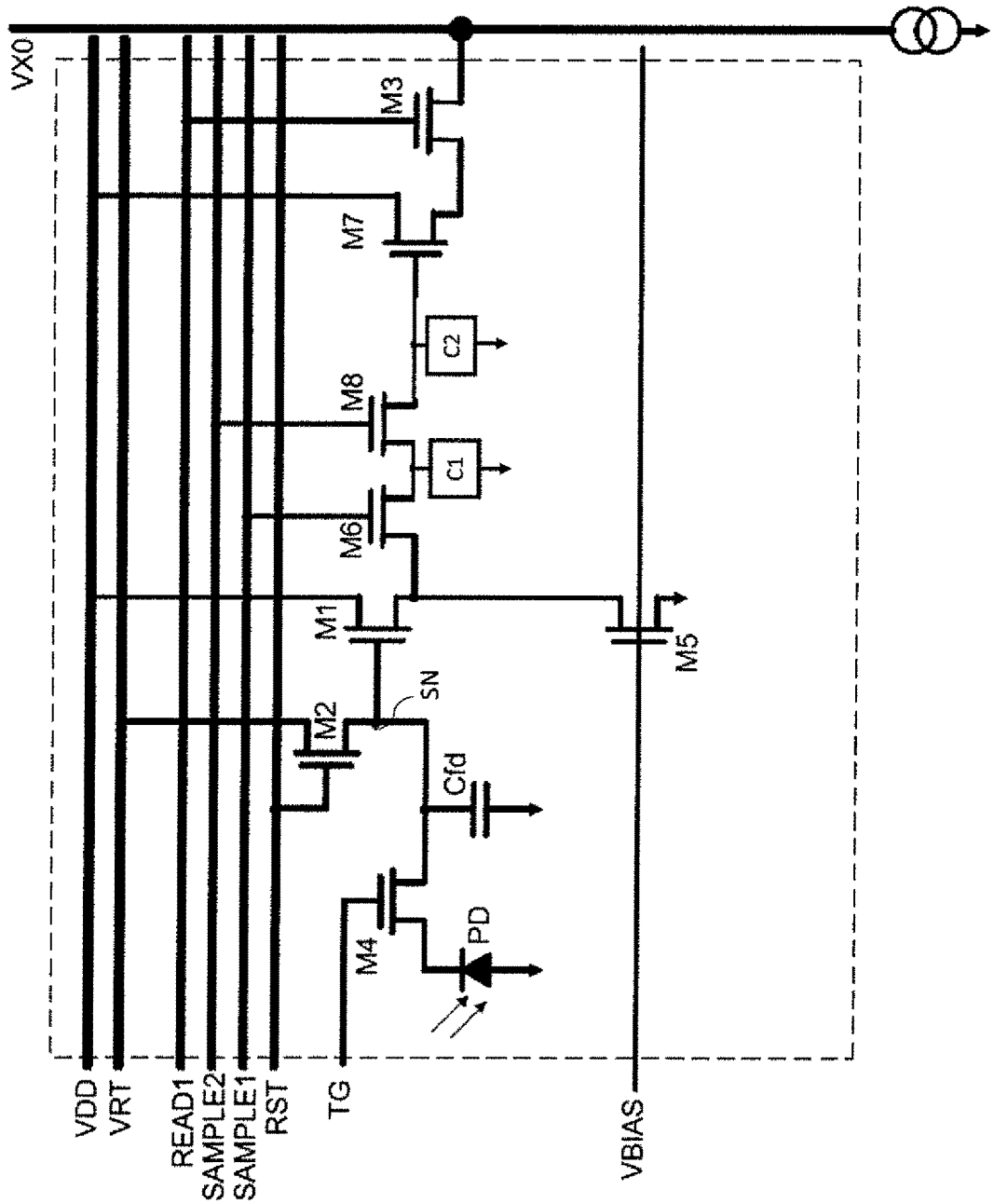
FIG. 1 is a schematic diagram of an 8T (8 transistor pixel arrangement)

Global shutter (GS) pixels may have more transistors than rolling blade pixels and so may be larger. As far as rolling blade pixels are concerned, there may be a benefit of larger pixels for rolling blade pixels as they can collect more light.

If a rolling blade shutter arrangement is used, pixels are processed line by line, one being integrated and another being read out for each movement of the shutter. The shutter moves over the array so that all the pixels are exposed for the same amount of time, but not all at the same time.

If a global shutter arrangement is used, all pixels are simultaneously released from reset and start to integrate simultaneously. After a specific period, all the pixels are then read out simultaneously into a temporary storage, which may be located inside the pixel. This temporary storage is then scanned out row by row where the signal is amplified or converted into a digital value. Some prior-art global shutter pixels have more transistors than rolling blade pixels and so are larger. Hence, despite recording an image with greater temporal accuracy, the pixel type in most image sensors are rolling blade as smaller pixel size permits a smaller sensor for the same image array format (#pixels).

For many years the trend for cameras was to have more smaller pixels. However smaller pixels have smaller charge storage capacity (full well) and so may produce images with worse signal-noise ratio due to photon shot noise as compared to a larger pixel. In contrast to the size of rolling blade pixels, global shutter pixels have been typically 10 µm×10 µm and most current production is in 5.6 µm×5.6 µm in size and recent published papers suggest pixel sizes of 3.75 µm×3.75 µm.

As will be described in more detail, some embodiments, allow for vertical stacking of the relatively large area consuming parts of the GS pixel which permits the pixel size to be shrunk down. For example, some embodiments may have a pixel size of around 2.0 µm×2.0 µm. This may make the size of global shutter GS pixels sufficiently small as to be appropriate for high volume applications, in some embodiments.

A so called 4T (4 transistor) pixel, has a buried photodiode (so that it is immune to dark current generated at the surface and hence has a relatively low dark current and is typically engineered so that it can be fully depleted, i.e. there are no electrons stored on it during reset and so is immune to kTC noise). The 4T pixel has the possibility of to be used as a global shutter pixel as it has a storage node inside the pixel. However, it may not work well under high light levels as once the charge on the photodiode has decayed to ground, further photo-generated charge will not be stored in the photodiode but may flow to adjacent pixels, degrading the image in a process called "blooming".

Systems with global shutter pixels are usually used to freeze motion on fast moving objects. To successfully freeze motion, the shutter (exposure or integration) time must be short and hence there is typically a high light level during operation of global shutter image sensing systems and so blooming may be an issue.

A so-called 7T pixel has been proposed which may address the problem with parasitic light sensitivity and dark current by having a source follower in the pixel and storing the signal (now a voltage) on a larger capacitor. The capacitor may be a metal-metal structure, but often a MOS structure is used as this has greater capacitance per area. However, this arrangement may not be suitable for rapid acquisition of images as the image still needs to be read out from the array before the next one is acquired. However the techniques described below which may allow a smaller pixel to be achieved may be used with this pixel.

Reference is made to FIG. 1 which schematically shows an 8T pixel which has two storage elements (capacitors) C1 and C2 per pixel. The pixel has a photodiode PD which is sensitive to light. A transfer gate transistor M4 is provided. The transfer gate transistor M4 is controlled by a transfer gate signal TG. The drain of the transfer gate transistor M4 is coupled to a sense node SN whilst its source is coupled to the photo diode PD. A reset transistor M2 is provided which has its gate controlled by a reset signal RST. The source is coupled to a voltage VRT and its drain is coupled to the sense node SN. A diode source follower transistor M1 is provided with its gate coupled to the sense note SN, its source coupled to a voltage VDD and its drain coupled to a bias transistor M5. The bias transistor M5 has its gate coupled to a bias voltage VBIAS and its drain coupled to ground. A first switch is provided by a transistor M6 and a second switch is provided by a second transistor M8. The gate of the first switch transistor M6 is coupled to a SAMPLE1 control signal whilst the gate of the second switch transistor M8 is coupled to a SAMPLE2 control signal. The source of the first switch transistor M6 is coupled to the drain of the diode source follower transistor M1 and its drain is coupled to the source of the second switch transistor M8. The drain of the second switch transistor M8 is coupled to the source of a read transistor M3. The drain of the read transistor M3 provides the output voltage VX0. The read transistor M3 receives a READ1 signal at its gate to control the reading of the pixel. Cfd is a capacitance which will store some of the charge from the photodiode.

In prior proposed 8T pixel arrangements, the pixel has two storage elements, C1 and C2. These are coupled to the drain of the first switch transistor M6 and the drain of the second switch transistor respectively. This allows for storing the reset voltage level of the floating diffusion node (shown as Cfd) in the second capacitor C2 and then transferring the photo-generated charge into the floating diffusion and storing the voltage in the first capacitor C1. Subsequently the reset voltage can be read out and then some combination of the signal voltage and the reset voltage can be read out allowing for variations of the source follower transistor's threshold voltage to be compensated.

Figure 2A:
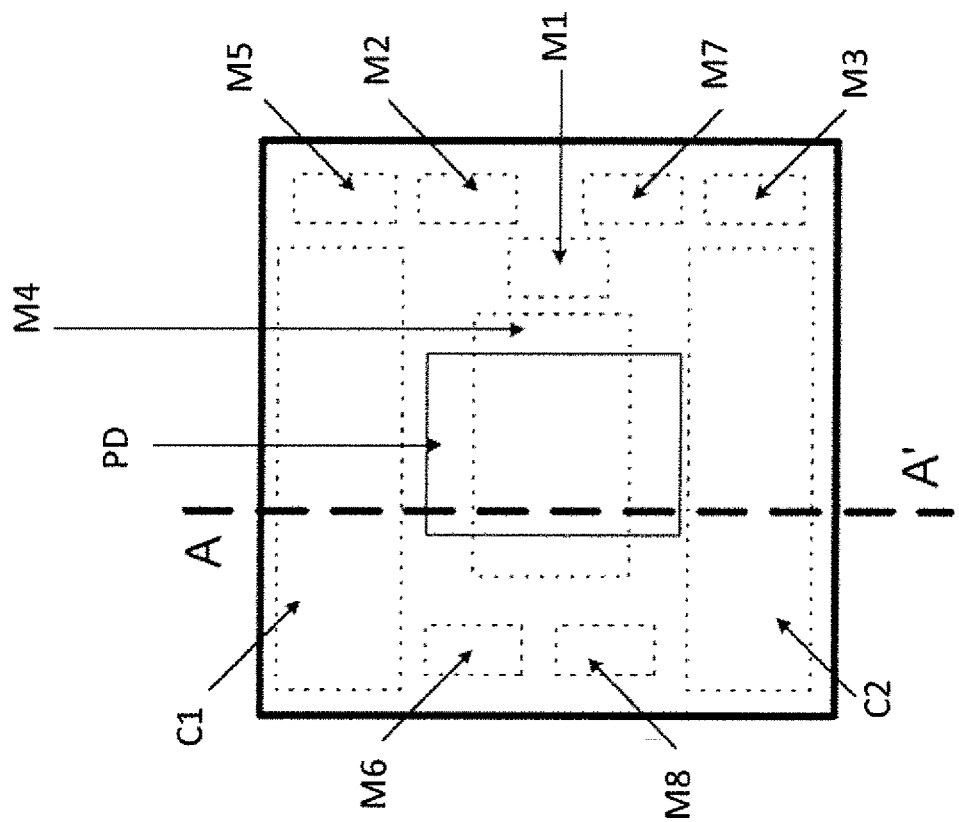
FIG. 2a is a plan view of an 8T global shutter pixel as previously proposed.

FIG. 2a shows a plan view of a global shutter transistor with 8 transistors as previously proposed. The poly/gates of the transistors are shown in FIG. 2a as dashed lines. For clarity, the source, drains and gates of the transistors are not shown.

As can be seen the photodiode PD is in a central region of the pixel with the transfer gate M4 overlying that photodiode. The photodiode is surrounded on four sides by the remaining transistors and capacitors. On opposite sides of the photodiode are the capacitors C1 and C2. These are respectively provided on the first and third sides of the pixel. The bias transistor M5 is arranged in the corner area of the first and second sides of the pixel. The read transistor M3 is arranged in the corner area of the second and third sides of the pixel. Between the bias transistor M5 and the read switch M3 are, in the following order along the second side of the pixel, the reset transistor M2, the diode source follower transistor M1 and the output source follower transistor M7. The first switch transistor M6 is next to the first capacitor C1 on the fourth side of the pixel and the second switch transistor M8 is next to the second capacitor C2, also on the fourth side of the transistors.

The sample/hold capacitors C1, C2 are key to the operation of the pixel. It may be desirable to maximize their capacitance for various reasons:

1. Parasitic Light Sensitivity (PLS). In a sensor with global shutter pixels, all pixels simultaneously capture and then sample the intensity. However the signals stored on the sample/hold capacitors are read out in a row-sequential manner. One row will be read out shortly after the sample operation (e.g. a few μs) however the last row will be readout later (20 ms if the readout rate is 50 Hz). Typically, light is still impinging on the sensor during the readout operation and so will produce photo-generated charge. Some of this charge will be collected by the implants of the first and second switch transistors M6 and M8 and so will change the voltage stored on the sample/hold capacitors. This may degrade the signal $\delta V = \delta Q / CSH$ Where V is voltage, Q is charge and CSH is the sample and hold capacitance. As can be seen from the above equation, the larger the sample/hold capacitance CSH, the smaller the resulting change in voltage stored on the sample/hold capacitors (i.e. capacitors C1 and C2) and hence the signal is degraded less, i.e. PLS is reduced.

2. The capacitors sample the voltage and so there is a random variation in the voltage $V_{kTCNoise}$ stored on the capacitors when the switch is opened. This is commonly referred to as "kTC noise" from the voltage's relationship to Boltzmann's constant, k temperature T in Kelvin and the capacitance $C_{SH}$.

$$V_{kTCNoise} = \sqrt{\left(\frac{kT}{C_{SH}}\right)}$$

3. Charge Injection. There will be charge stored in the channel of the switch transistors M6, M8 and when these switches are opened at the end of the sample operation, the charge will be injected into the sample/hold capacitors C1 and C2. Larger capacitors will reduce the effect on stored voltage.

4. Matching. The 8T pixels may be sensitive to the matching of the capacitances C1 and C2 as during readout of the signal, the charges on the two capacitances are shared and the resulting voltage readout. Pixel-pixel variation in the mis-match of the sample/hold capacitors will produce a pixel-pixel variation in the output voltage, i.e. noise in the image.

As a result of these factors, the size of the sample/hold capacitors C1 and C2 is increased as much as possible. A typical sample hold capacitor will be 20 fF, which will produce a $V_{kTCNoise}$=455 μV and if there is a conversion gain of 100 μV/electron, this corresponds to 4.5 electrons equivalent read noise.

Hence, as can be seen in FIG. 2a, a large area of the prior proposed 8T pixel is used to implement the sample/hold capacitors C1 and C2.

Figure 2B:
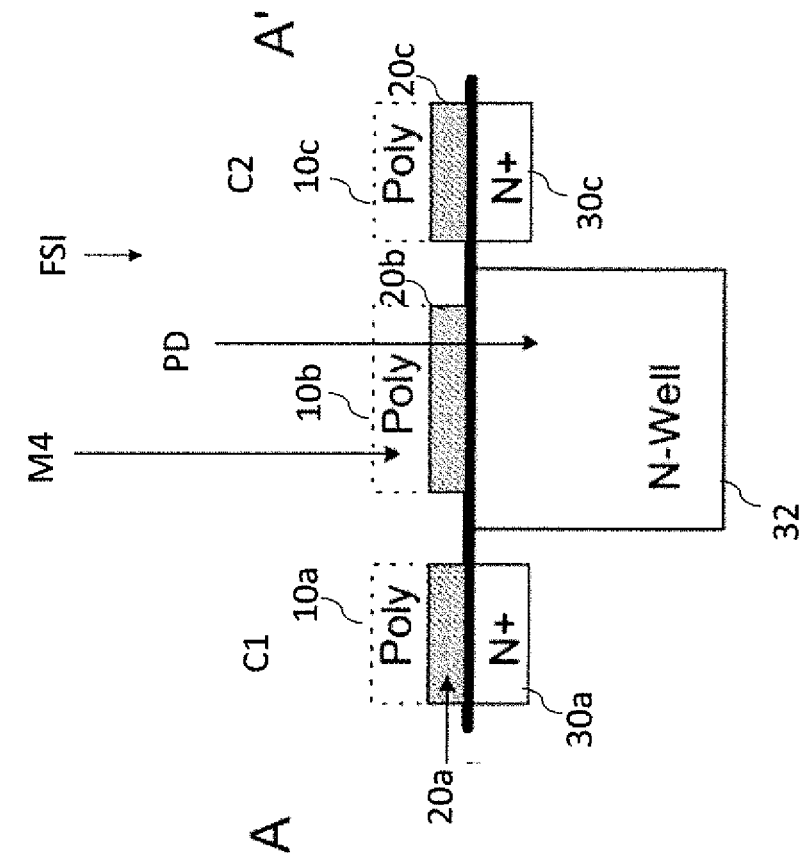
FIG. 2b is a cross section of the pixel of FIG. 2a taken along line A-A'.

Reference is now made to FIG. 2b which shows a cross section of the plan view of FIG. 2a along line A-A' which shows a previously proposed architecture for the 8T pixel. In the example, an N-well 32 in the substrate provides the photodiode PD. On either side of the N-well is an N+ implant area, the first N+ implant area 30a for the first capacitor C1 and the second N+ implant area 30b for the second capacitor C2. Next on the substrate is the gate oxide 20a, 20b and 20c. For the first capacitor C1, the gate oxide 20a is the insulator between the two terminals—one is the poly (or gate) 10a and the other is N+ implant 30a. For the second capacitor C2, the gate oxide 20b is the insulator between the two terminals—one is the poly (or gate) 10c and the other is N+ implant 30c. The transfer gate transistor M4 is formed by the gate oxide 20b on the N-well 32 and the associated poly layer 10b on the side of the gate oxide opposite the N-well 32. In order to have the required capacitor size with the architecture shown in FIGS. 2a and 2b has resulted in the prior proposed pixels being relatively large.

Other types of global shutter pixel are known, such as the 10T (10 transistor pixel). With the 10T pixel, each of the two storage capacitors have separate readout. This prevents the charge sharing that may occur with the 8T pixel when the switch associated with the second pixel is opened during the pixel readout. Hence the two signals (reset and photodiode) are available. Further, as there is no charge sharing between the first and second capacitors C1 and C2, the pixel-pixel matching of the sample/hold capacitors is not as critical.

Currently global shutter pixels use front side illumination FSI, as shown in FIG. 2b. To reduce PLS in FSI operation, it is preferable to shield the sample/hold circuitry (including the switches) with metal to prevent light from impinging on the silicon and creating photo-generated charge which will change the voltage stored on the capacitor in the time between photo-diode sampling and pixel-readout.

In contrast, in back-side illumination (BSI) pixels, the photons impact the silicon on the opposite side to the diode implants. The photodiode may be implanted deeper so it is close to where the photons impinge on the silicon surface. This type of photodiode is typically called a "Vertical Photodiode". BSI technology may enable the manufacture of small, light-sensitive pixels as the transistors and metal wires do not obstruct the photons.

In some embodiments, the capacitance of the sample/hold capacitors may be increased, thereby improving pixel performance for the reasons discussed above and/or reducing the pixel size while maintaining pixel performance. In some embodiments, global shutter pixels of a similar size to rolling blade pixels may be used.

In some embodiments, GS pixels are provided which work with BSI and use implants to shield the sensitive nodes of the sample/hold circuitry to reduce PLS.

In some embodiments, using BSI technology, it is possible to add metal layers without affecting the optical performance (fill factor, quantum efficiency etc.) and therefore in some embodiments, at least one and preferably both of the sample/hold capacitors C1, C2 may be implemented using metal layers. Optionally, these are MOM (metal-oxide-metal) capacitors, or MIM (metal/intermetal dielectric/metal) capacitors or metal insulator metal capacitors. The dielectric material may be relatively thin (e.g. 10-50 angstroms). Alternatively or additionally the dielectric material may be of a high dielectric constant (with high relative permittivity) materials. For example, the dielectric constant may be 15-30 F/m. In some embodiments, the dielectric material may be tantalum, titanium nitride, silicon oxide, silicon dioxide, silicon nitride, aluminum oxide, hafnium oxide, hafnium dioxide, hafnium silicate, HfSiON (hafnium, silicon oxi-nitride), zirconium dioxide, zirconium silicate, and lanthanum gadolinium oxide.

In some embodiments, using BSI, a large proportion of the pixel may be covered with metal layers to create a large sample/hold capacitance without hindering optical performance. For example, for a single capacitor in a pixel, 90% of the area may be covered. For two capacitors in the pixel, the area may be 85%. However, for plates, that can be continuous over the array, the percentage of the area covered may be 100%. Accordingly in some embodiments at least 80% of the area of the pixel may be covered with metal layers and preferably more. This area is the area which defines the spacing between adjacent pixels in an array.

Figure 3A:
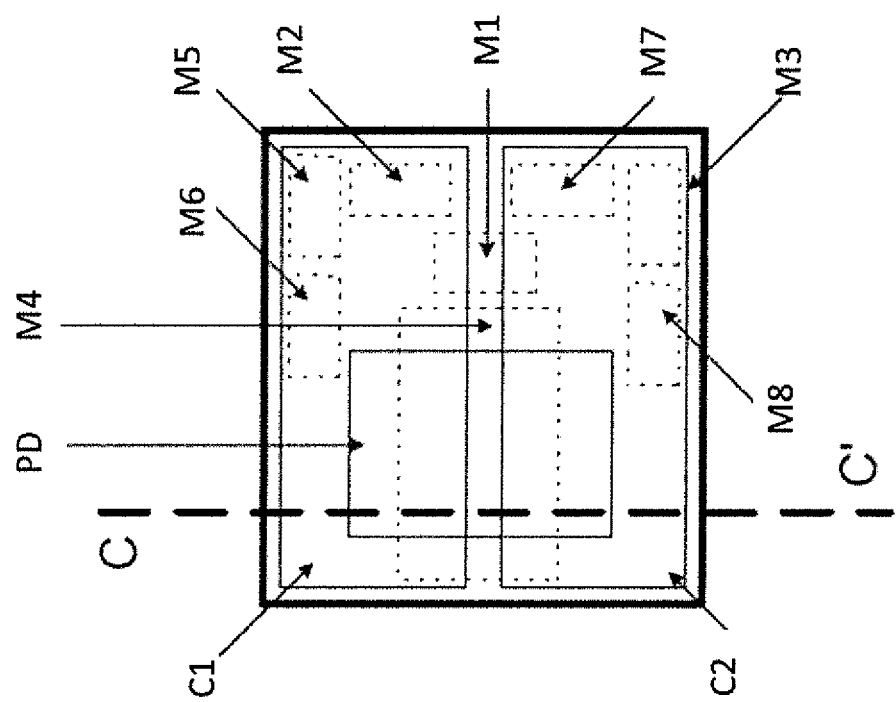
FIG. 3a is a plan view of an 8T pixel, according to one embodiment.

Reference is now made to FIG. 3a which shows a plan view of an 8T pixel of an embodiment in which a metal MIM capacitor replaces the gate oxide/MOS capacitor used in the arrangement shown in FIGS. 2a and 2b. In this arrangement, the photodiode is arranged to one side of the pixel. The first and second capacitors C1 and C2 are arranged side by side. Each capacitor partially overlies the photodiode. The area required by the pixel is defined by the area of the two capacitors. The other components of the pixel underlie one or other of the capacitors, but not in the area occupied by the photodiode.

In the example shown in FIG. 3a, the switch M6 for the first capacitor M6, the bias transistor M5 and the reset transistor M2 are under the first capacitor C1. The switch M8 for the second capacitor, the read switch and the output source follower M7 are arranged under the second capacitor C2. The diode source follower M1 is arranged to be partially under the first capacitor C1 and partially under the second capacitor.

It should be appreciated that the layout shown in FIG. 3a is by way of example only and different embodiments may have different layouts of the different components. In some embodiments, the location of the capacitor may be determined by ease of connection to the circuitry underneath. Other metal capacitors may be used in other embodiments.

By using MIM capacitors, it is possible to keep the photodiode and transistors the same size, the capacitance of similar value and move it away from the silicon surface and so save area and hence reduce the pixel area. The size of the pixel is the area which a pixel needs to occupy in an array determines the size of the array.

Figure 3B:
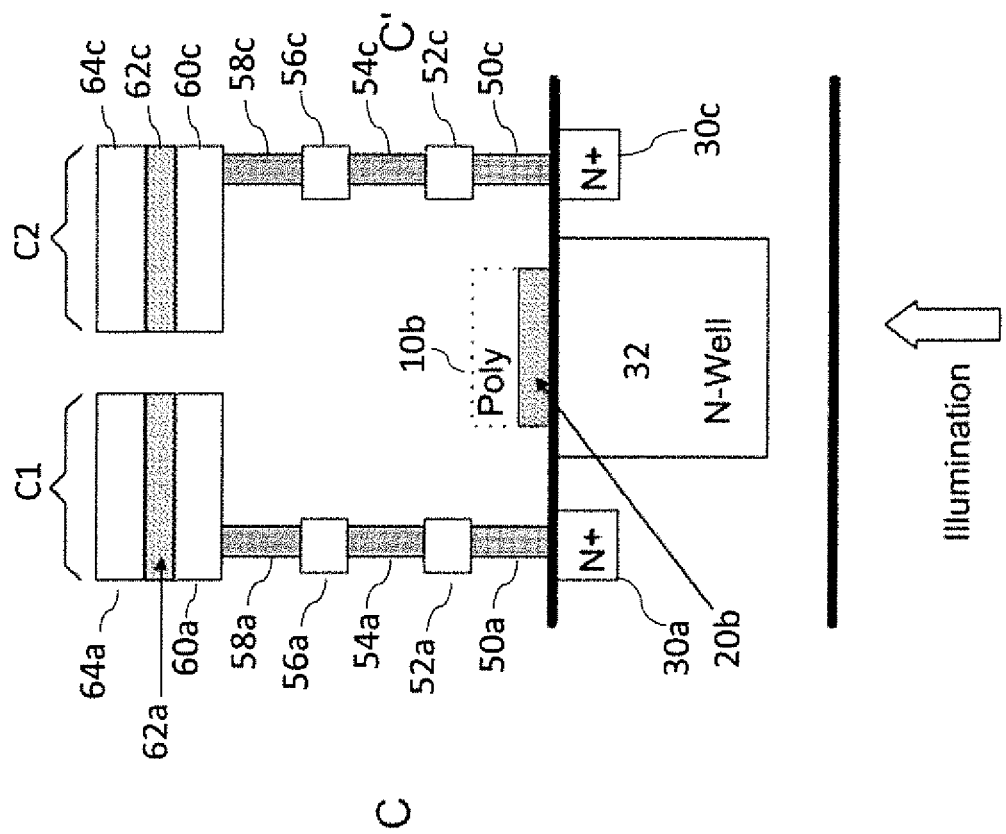
FIG. 3b is a cross section of the pixel of FIG. 3a taken along the line C-C'.

Reference is made to FIG. 3b which shows a cross section along line C-C' of FIG. 3a. As can be seen, the pixel has back side illumination. The transfer gate M4 and photodiode are as discussed in relation to FIG. 2b. The first capacitor C1 arrangement will now be described. An N+ implant 30a is provided. The following are provided in the following order on the N+ implant: Contact 50a, first metal 52a, first via 54a, second metal 56a, and second via 58a. These are to provide an electrical connection or path from the source/drains of transistors M6 and MB. The capacitor C1 itself comprises a first metal layer 60a in contact with the second via 58a, an insulator 62a and a second metal layer 64a. A mentioned previously, these may provide a MOM or a MIM capacitor. As can be seen, each capacitor partially overlies the photodiode. However a lateral gap is provided between the two capacitors. It should be appreciated that at least 50% or more of the pixel area is covered by these capacitors.

It should be appreciated that the second capacitor arrangement has the same structure as the first capacitor arrangement, with the corresponding parts referenced with the suffix "c" instead of "a". The contacts 50a and 50c are arranged on either side of the transfer gate M4.

Figure 4:
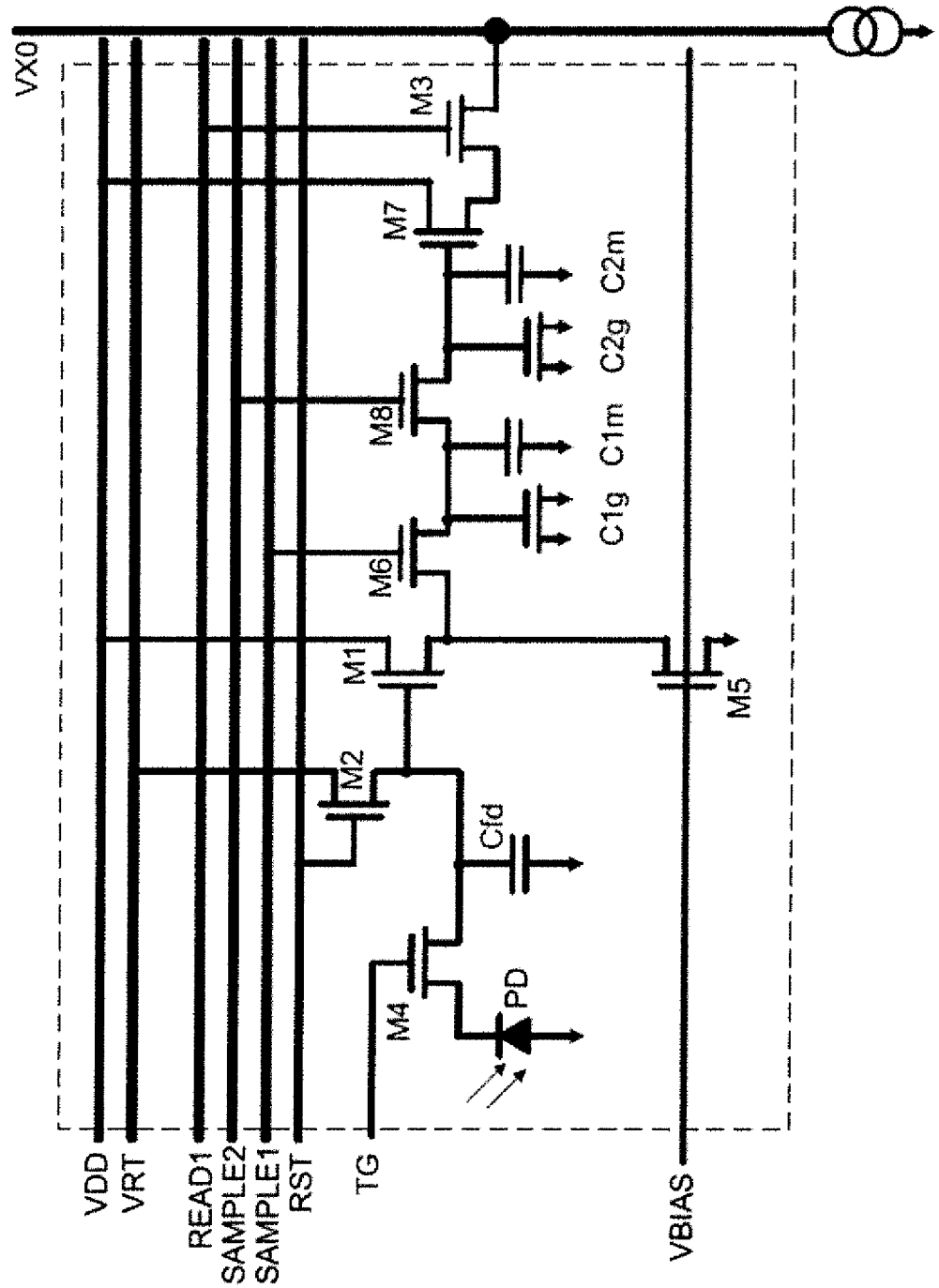
FIG. 4 is a schematic diagram of another 8T pixel of another embodiment.

Reference is made to FIG. 4 which shown another embodiment for an 8T pixel. In this embodiment, a MIM capacitor C1 is in parallel with a gate oxide capacitor C1g (such as shown in FIG. 2b). Similarly a second MIM capacitor C2 is in parallel with a second C2g gate oxide capacitor. In alternative embodiments, a MOM capacitor may be used.

Figure 5A:
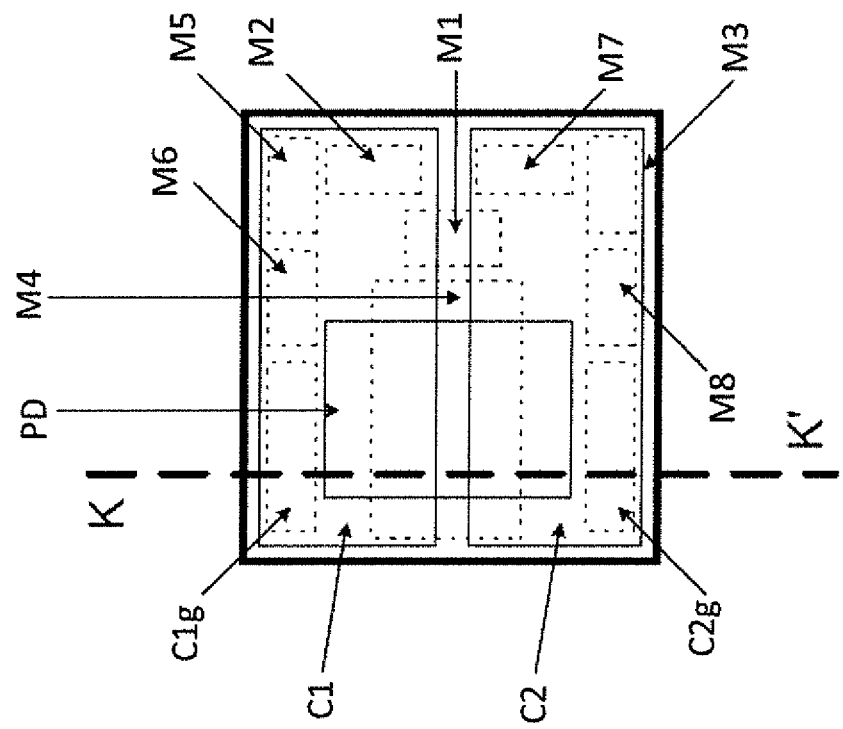
FIG. 5a is a plan view of the pixel of FIG. 4.

Reference is made to FIG. 5a which shows a plan view of the arrangement of FIG. 4. The plan view of FIG. 5a is similar to that of the embodiment of FIG. 3a. However, additionally the first gate oxide capacitor C1g is provided under the first MIM capacitor C1 adjacent the part of the photodiode which underlies the first MIM capacitor C1. Likewise, additionally the second gate oxide capacitor C2g is provided under the second MIM capacitor C2 adjacent the part of the photodiode which underlies the second MIM capacitor C1.

Figure 5B:
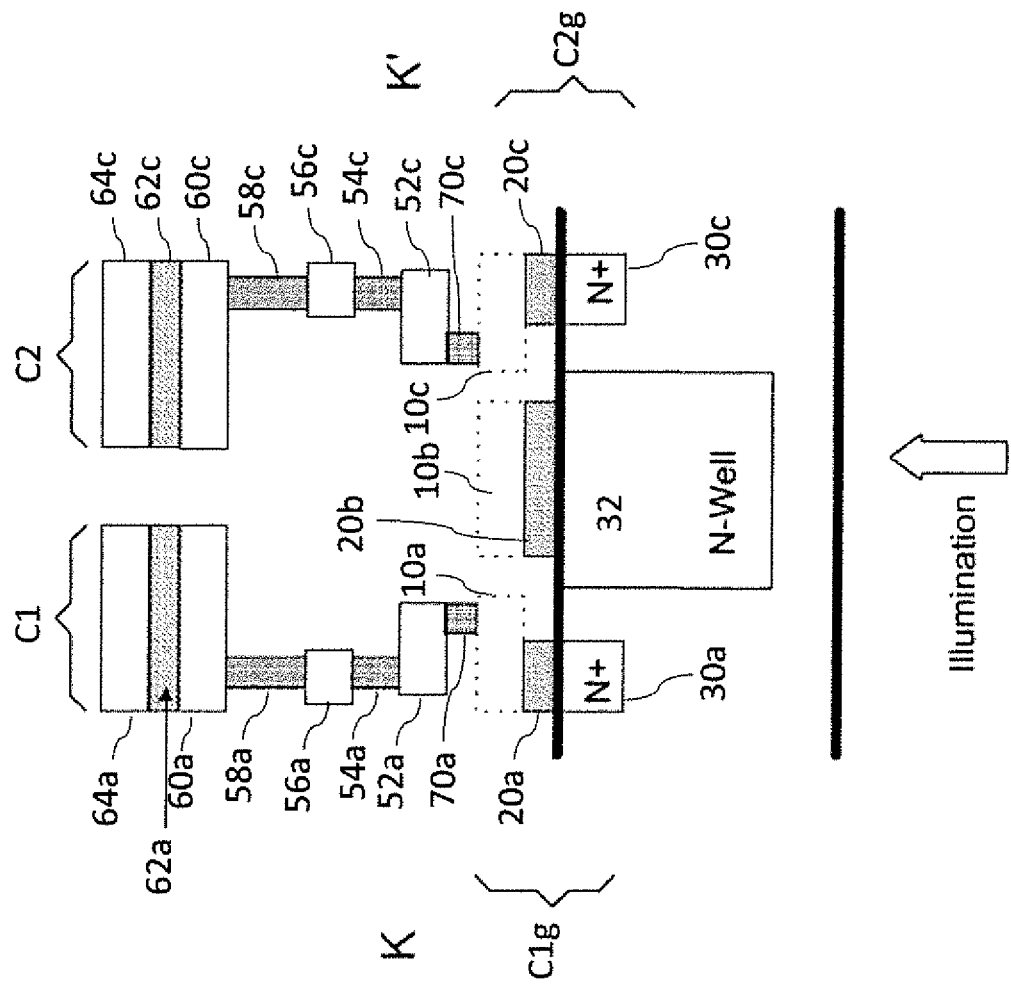
FIG. 5b is a cross section of the pixels shown in FIG. 5a taken along line K-K'.

Reference is made to FIG. 5b which shows a cross section of FIG. 5a along line K-K'. The structure is generally the same as the discussed in relation to FIG. 3b. However, on the N+ implant 30a, a first gate oxide 20a is provided with a poly layer 10a to provide the first gate oxide capacitor C1g. A contact 70a is provided the first metal 52a. The structure is then the same as shown in FIG. 3b in order to provide the MIM capacitor C1. Similarly, on the N+ implant 30c, a gate oxide 20c is provided with a poly layer 10c to provide the second gate oxide capacitor C2g. A contact 70c is provided for the first metal 52c. The structure is then the same as shown in FIG. 3b in order to provide the MIM capacitor C2.

Figure 6:
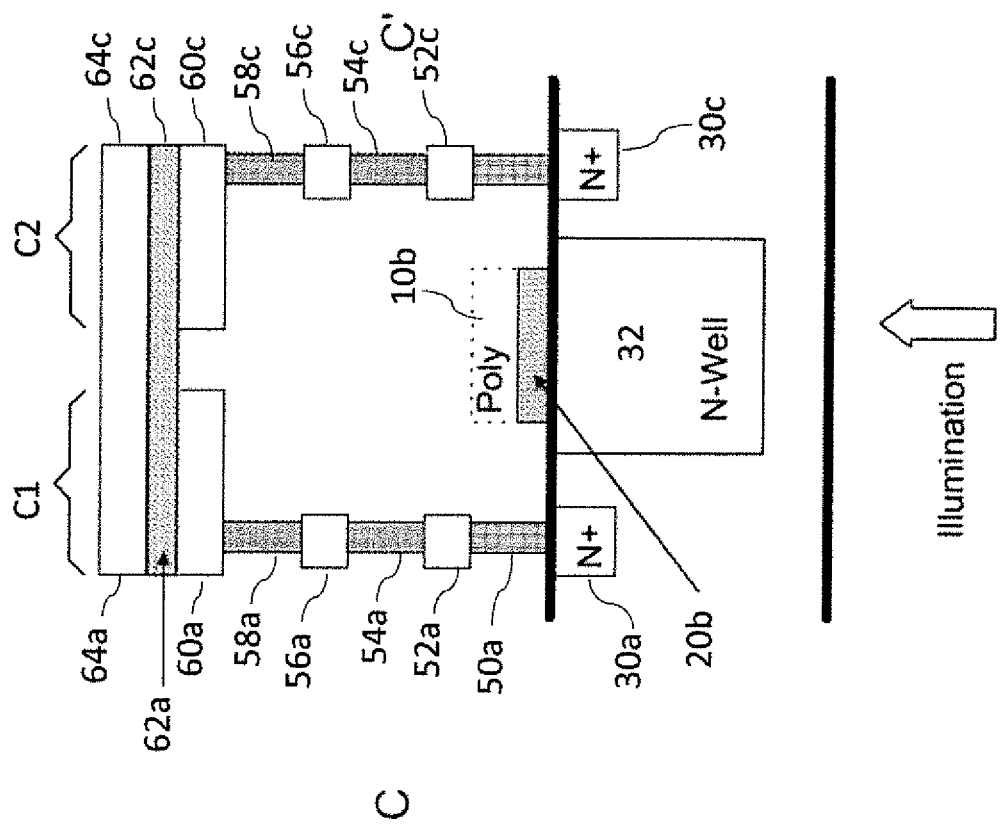
FIG. 6 is a cross section of a modification to the 8T pixel arrangement of FIG. 3b.

Reference is made to FIG. 6 which shows a modification to the arrangement shown in FIG. 3b. As can be seen from FIG. 1, the sample/hold capacitors C1 and C2 share a common connection, in this case ground. In the modification shown in FIG. 6, a continuous conductor 64 is provided for this plate. In the arrangement shown in FIG. 3b, all four of the capacitor plates (two for each capacitor) are independent of one another. In the modification shown in FIG. 6, the second metal layer 64 of the first and second capacitors C1 and C2 are provided by a common metal layer 64 (as compared to the arrangement of FIG. 3b where the second metal layer is provided separately for each capacitor C1 and C2). The dielectric or insulator material 62 may also be provided by a common layer. The insulator layer 62 may be continuous (similar to layer 64) or patterned similar to layer 60a/60c. If patterned, then insulator may be slightly wider than the metal.

If the pixel shown in FIG. 6 is implemented in an array, then capacitor C1 from one pixel may be adjacent to capacitor C2 from a different pixel. In some embodiments, the electric fields may cause a crosstalk between adjacent pixels.

In some embodiments, this may be mitigated by having a shield in between the plates of the capacitors of the different pixels. This may take up additional area and/or may reduce the useful capacitance of the pixel. Nevertheless this solution may provide advantages in some embodiments.

Figure 7A:
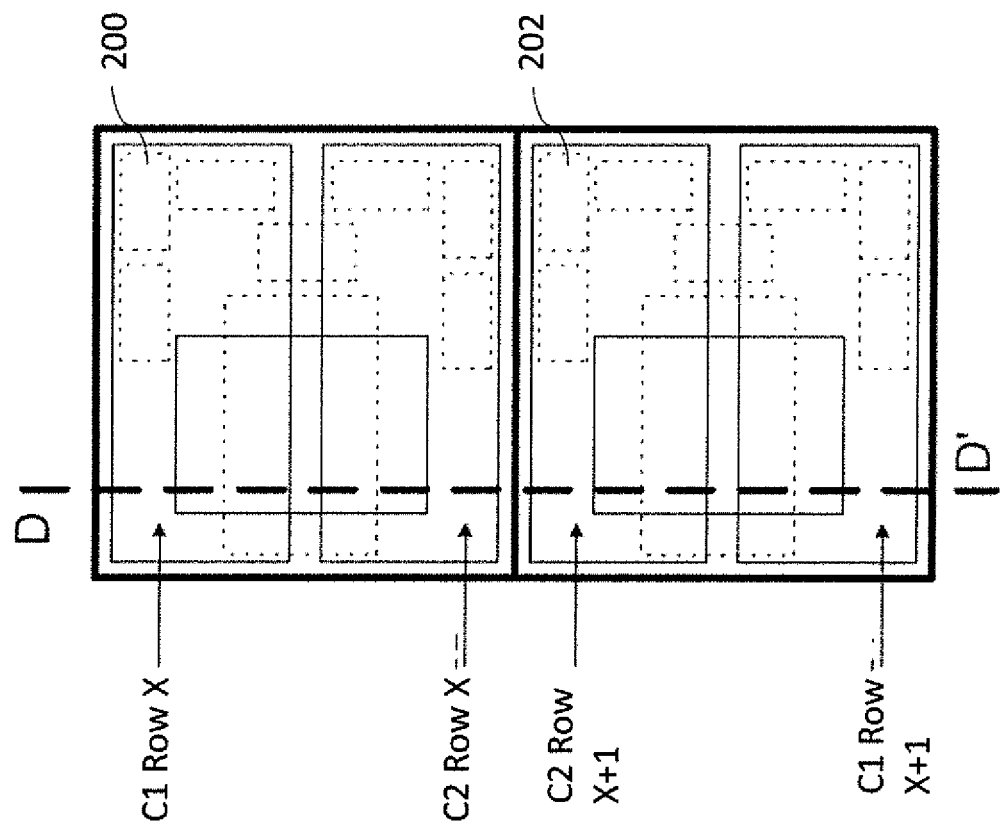
FIG. 7a is a plan view of two 8T pixels of an embodiment.

Reference is made to FIG. 7a which shows one embodiment and in particular shows the layout of two pixels. These pixels may be as shown in FIG. 6 or as described in relation to other embodiments. In this embodiment, the layout of the capacitors C1 and C2 is alternated between pixels. This may be implemented by mirroring the whole pixel layout or just the connections to the capacitors. In the example shown, the pixels have a common plate. It should be appreciated that embodiments may be used where the capacitors do not share a common plate.

In the embodiment shown in FIG. 7a, two pixels 200 and 202 are shown, arranged in one column and two rows, row X and row X+1. In some embodiments, many more than the two pixels shown may be provided.

In the first pixel 200, the first capacitor C1 extends across the pixel, in the row direction of the array as does the second capacitor C2. Likewise in the second pixel 202, the first capacitor C1 extends across the pixel, in the row direction of the array as does the second capacitor C2. In both pixels, a gap is defined between the capacitors, or at least one of the layers of the capacitors (in the case where they share a common plate and dielectric) in the direction parallel to the row direction of the array. However, the second capacitor C2 of the first pixel 200 is arranged so as to be adjacent the second capacitor C2 of the second pixel. If a third pixel were to be added to the column of the array shown in FIG. 7a, to row X+2, that pixel would be such that the first capacitor C1 of that pixel may be adjacent to the first capacitor of the second pixel 202 and so on.

As the first capacitor C1 will store the reset value from all the pixels, the C1 capacitors of all the pixels in the array will be driven at the same time and despite their proximity of C1 capacitors of adjacent pixels, they will store the required voltage accurately. Further, the plates C1 on adjacent pixels, although are physically close together, are of similar voltage. Hence as the voltage difference is small, the electric field between the two plates of adjacent rows will be small and so there will be small crosstalk between adjacent pixels using this improvement.

Figure 7B:
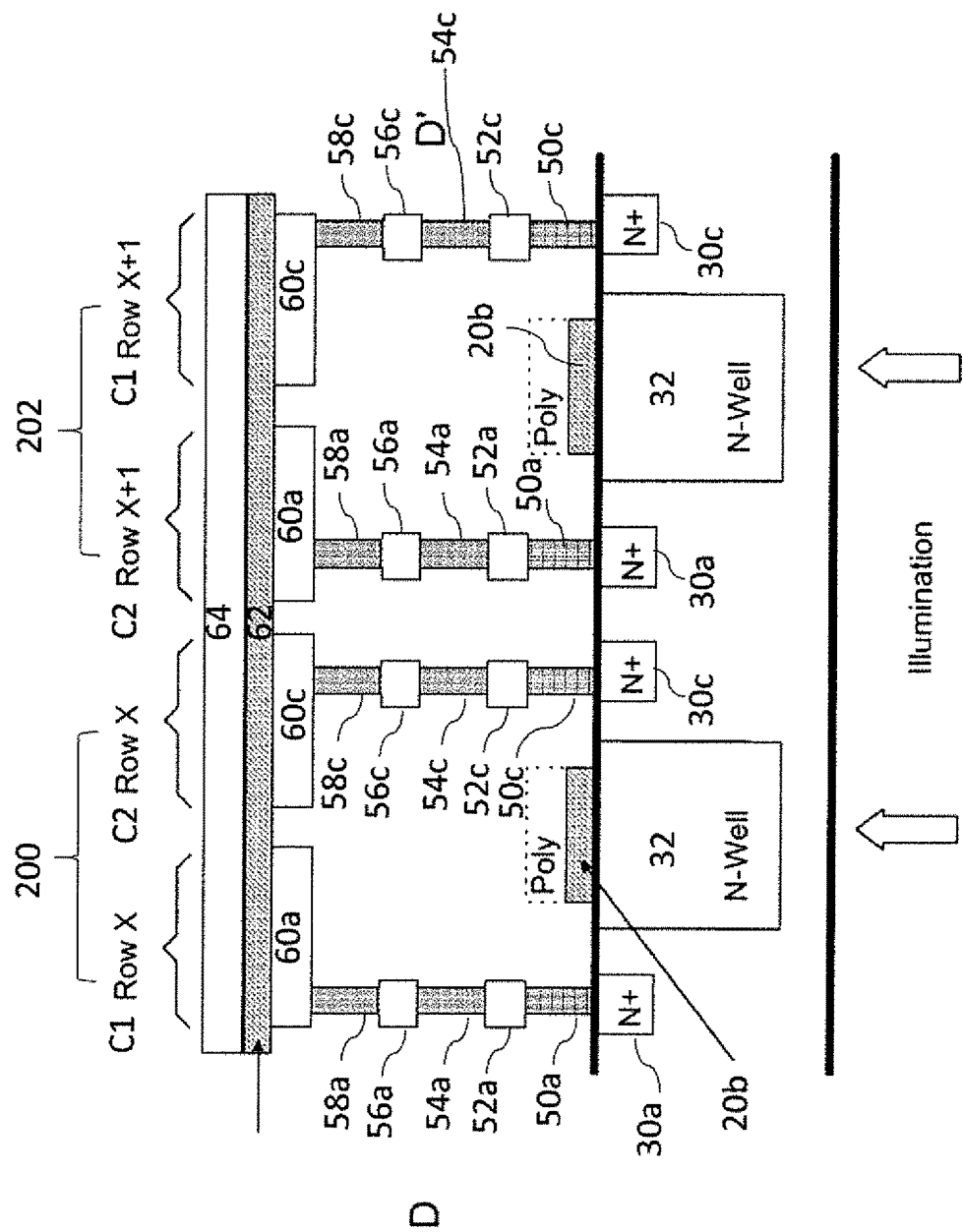
FIG. 7b is a cross section of the pixels of FIG. 7a taken along line D-D'.

The second capacitors C2 are also driven at the same time (e.g. to store the intensity value from the photodiode). In some embodiments the first capacitor C1 of column X1 may be isolated from columns X0, X2 but again these will be driven at the same time. Some embodiments may address the problem which arises when a capacitor is driven and a neighbor capacitor is floating which may result in charge being coupled in. Hence, in some embodiments, a larger space is provided between the first and second capacitor of one pixel than between the first capacitors of adjacent pixels Reference is made to FIG. 7b which shows a cross section of the arrangement of FIG. 7a along line D-D'. The pixels have the structure of the pixel shown in FIG. 6. As can be seen, the second capacitor C2 of the first pixel 200 is arranged adjacent the second capacitor C2 of the second pixel. All of the four capacitors of the two pixels share a common dielectric and one common plate (e.g. to ground or the like). The dielectric may be continuous or patterned. If patterned, then the dielectric may be slightly wider than the metal.

Figure 8:
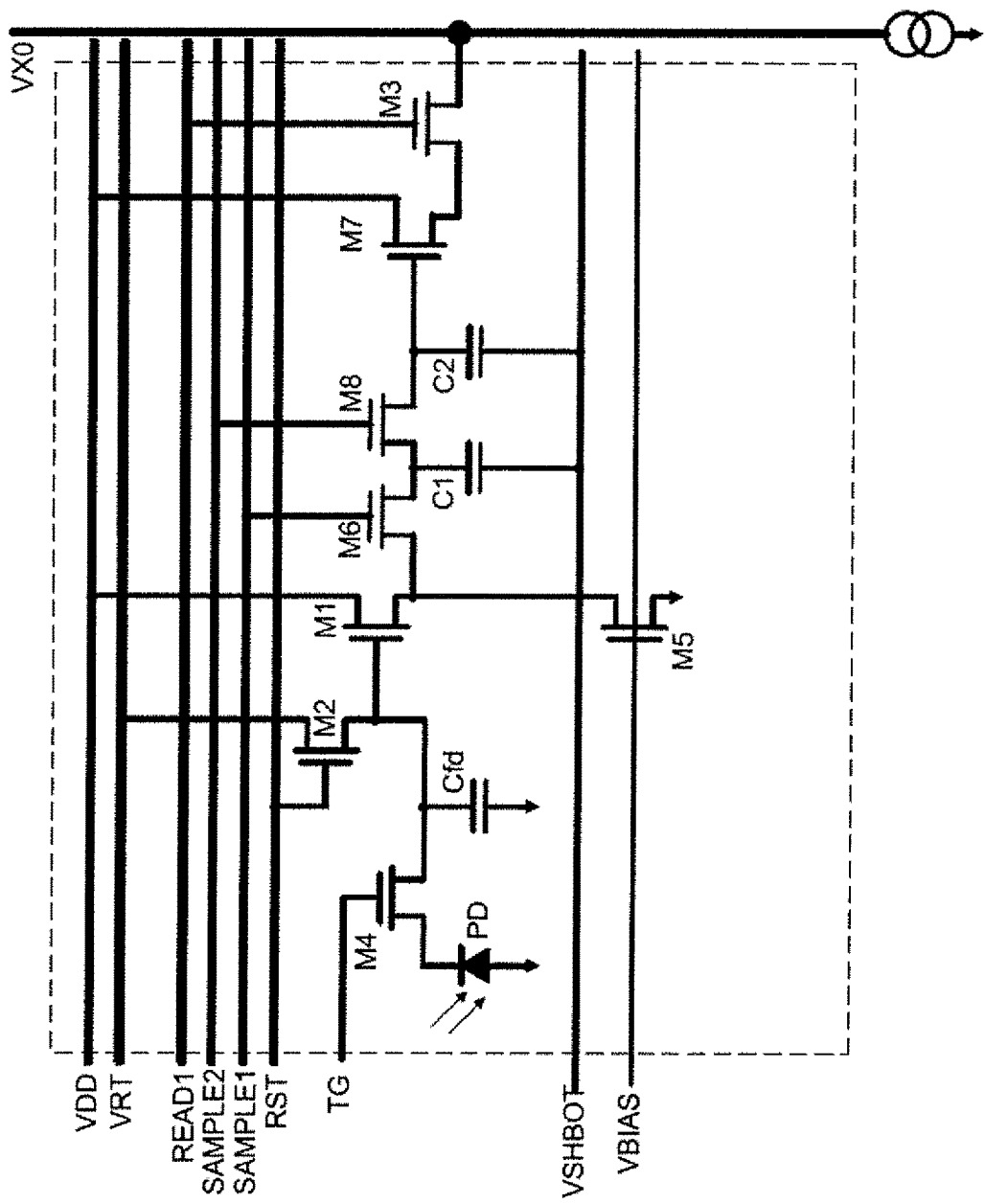
FIG. 8 is a schematic diagram of an 8T pixel which has a common plate for the capacitors.

A further embodiment will now be described with reference to FIG. 8 which shows another 8T pixel circuit. In this embodiment, instead of coupling the bottom plate of the capacitors C1 and C2, the MIM or MOM or any other suitable metal-metal capacitors may have the so-called bottom plate (plate held at a relatively lower voltage) connected to a different voltage, e.g. VSHBOT. This allows the voltage to be more tightly controlled in some embodiments. The control of VSHBOT will be described later.

Figure 9:
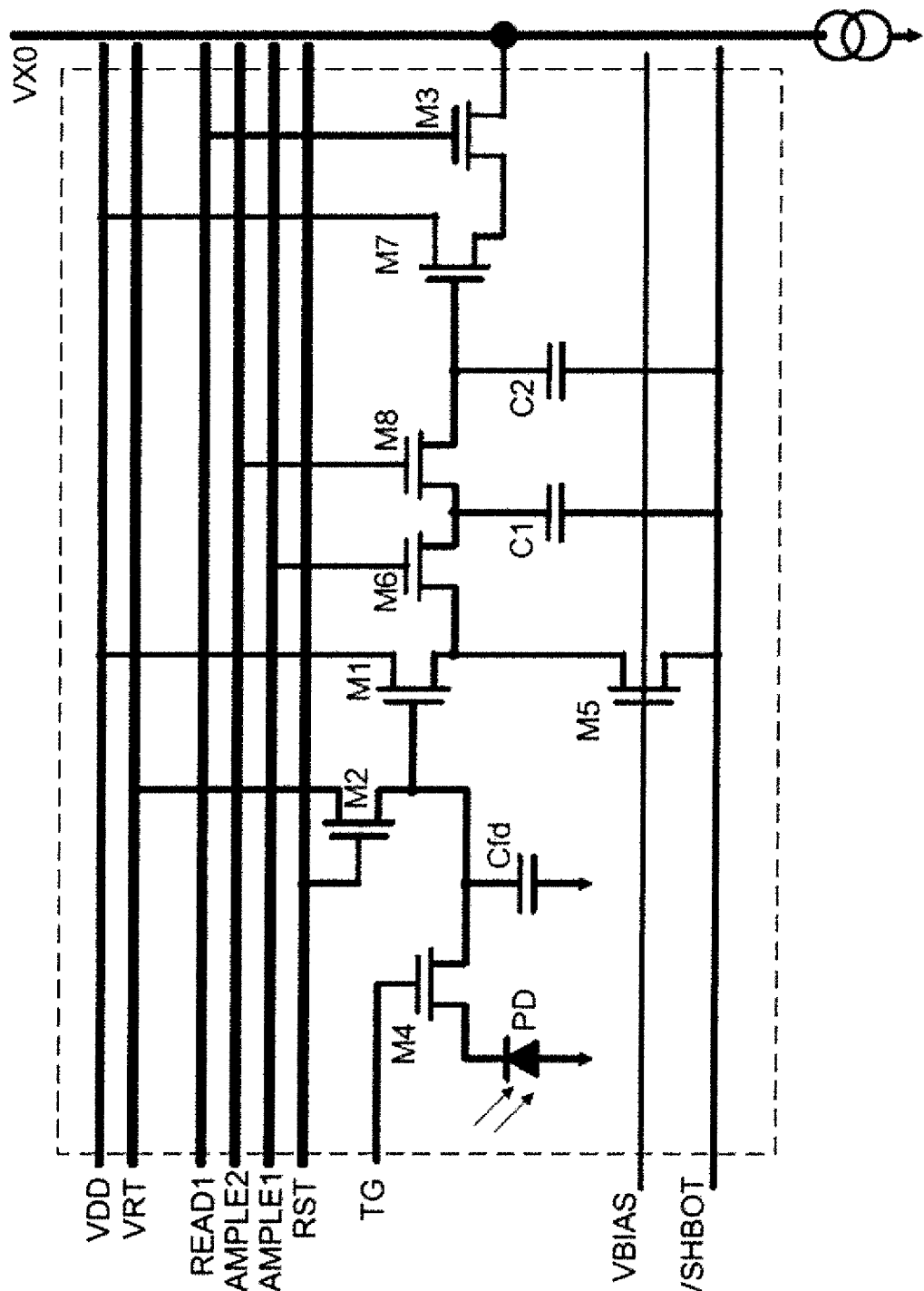
FIG. 9 is a schematic diagram of another 8T pixel which has a common plate for the capacitors and a bias transistor.

One of advantage of using metal-metal sample and hold capacitors instead of gate-oxide capacitors is that they are linear, i.e., the capacitance is independent of voltage across them. As the plate at VSHBOT may be physically large (for large capacitance), it may have a low electrical impedance. In some embodiments, the conductor (capacitor plate) VSHBOT could even cover the entire array. In one modification to the arrangement of FIG. 8, which is shown in FIG. 9, the VSHBOT is also be used as the connection to the drain of the bias transistors M5 in the pixels. Even though a small amount of current will flow through bias transistors M5 during the pixels' sampling operation, this current flows through every pixel at the same time and so the total amount of current in the array is large. For example if 1 µA flows through the bias transistor M5 during the sampling operation a 1M pixel array will require IA to flow and this improvement will reduce the resistance and resulting voltage drop across the array during sampling.

VSHBOT voltage can be adjusted to reduce the voltage across the plates of the capacitor. As the voltage is reduced, it is possible to reduce the thickness of the dielectric without increasing the electric field strength which would otherwise cause breakdown and damage to the insulation. Reducing the thickness may increase the capacitance of the capacitance of the capacitors which may further improve the pixel performance.

VSHBOT voltage may be at a predetermined voltage defined during the design of the sensor and/or may be adjusted during sensor operation for optimal setting. For example, this voltage may be half-way between the black voltage and image voltage stored on the capacitors. This could be achieved by monitoring of circuit elements which are similar construction to the imaging pixels, but which are not used for readout. Alternatively, VSHBOT could be determined by continuous monitoring of the voltages read out of the pixel array and optimizing this voltage.

Figure 20:
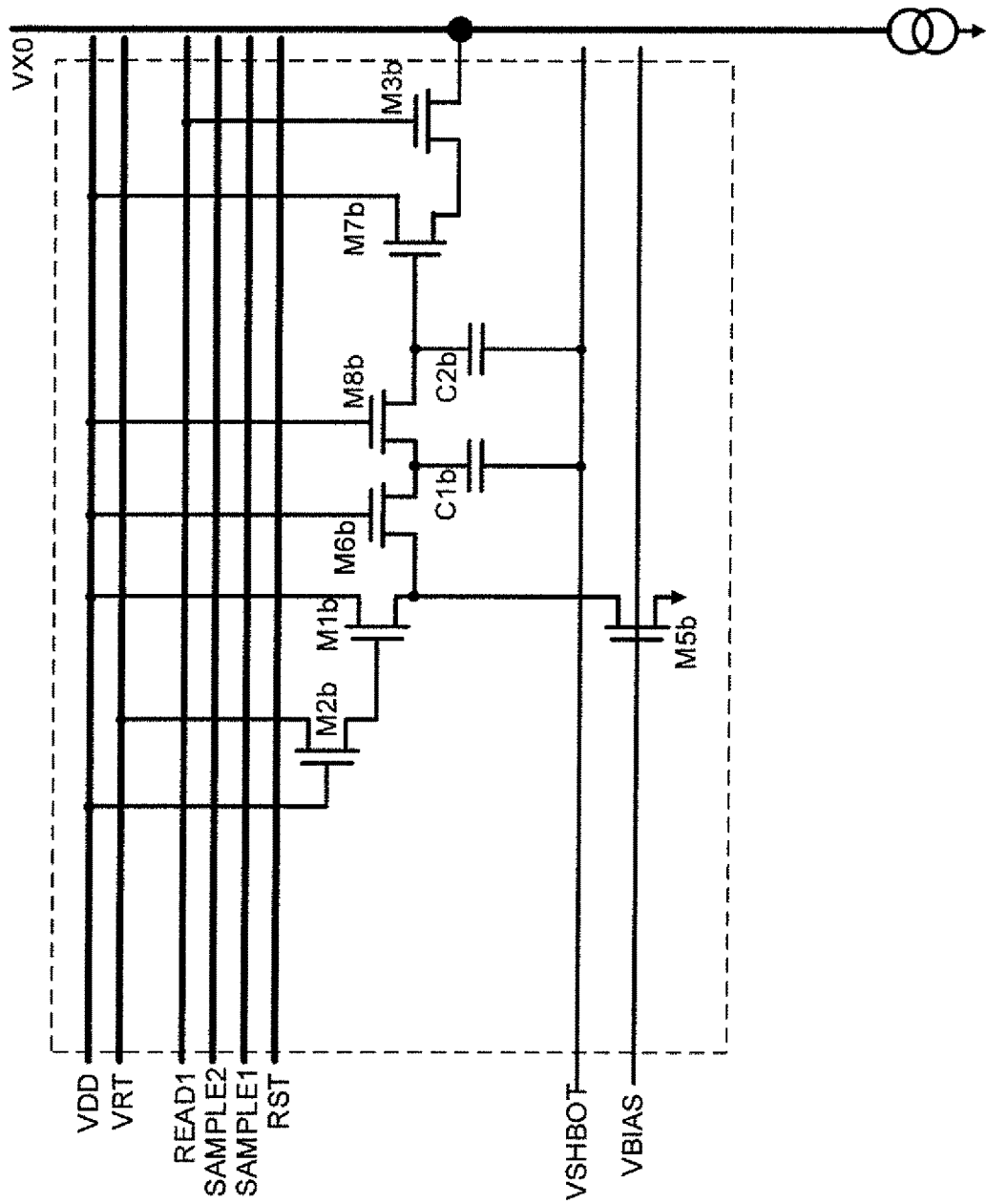
FIG. 20 is a schematic diagram of a pseudo pixel for black reference generation.

In this regard, reference is made to FIG. 20 which shows a pseudo pixel for black reference generation. This would be used in conjunction with a pixel such as shown in FIG. 8. Those transistors in FIG. 20 which are equivalent to those of FIG. 8 are referenced by the same reference number but with the suffix b. As compared to the pixel of FIG. 8, the pseudo pixel of FIG. 20 either has no photodiode and transfer gate or they are disconnected. The gate of the reset switch M2b is connected to a positive voltage VDD (or VRT) to turn reset transistor M2b on and so the gate of source follower transistor M1b is at the reset voltage VRT. The sample switch transistors M6b and M8b are also turned on by the voltage VDD. Hence when the pseudo-pixel is read out by taking READ1 line high, the output voltage will be VRT-VTM1b-VTM7b and so reflect the voltage that a "real" pixel will output for its reset (Black) voltage. VT is the threshold voltage.

The pseudo-pixels do not have a photo-sensitive element and are used to set VSHBOT to minimize the voltage across the S/H capacitors C1 and C2. VRT is known or measured. The threshold drop VT_M1b across transistor M1b and the threshold drop VT_M7b across transistor M7b are temperature and process sensitive. The output VX0 (black pixel) can be measured. An aim is to measure the voltage V_C1 across C1.

For the black pixel:

$V\_C1 = VRT - VT\_M1b$ $VX0 = VRT - VT\_M1b - VT\_M7b$

Assuming that $VT\_N1b = VT\_N7b$, then $VX0 = VRT - 2*VT\_N1b$

If VX0 (e.g. using the on-chip ADC) is measured and VRT is known or measured, then $VT\_N1b = (VRT - VX0)/2$ and so for the black pixel (which is most positive voltage):

$V\_C1black = VRT - (VRT - VX0)/2 = (VRT - VX0)/2$

From device calibration during development, the maximum voltage swing of the sense node=VSWING_MAX_SN Hence:

$$V\_C1\text{white}=(VRT-VX0)/2-VSWING\_MAX\_SN$$

If the capacitors need to be positive biased (i.e. to avoid reverse biasing them), $$VSHBOT=V\_C1\text{white}=(VRT-VX0)/2-VSWING\_MAX\_SN$$

However, if the capacitors can be positively or negatively biased, then to reduce the absolute voltage across the capacitors (and reduce the electric field strength and minimize the chance of breakdown), then VSHBOT may be set mid-way between the black and white voltages:

$$VSHBOT=0.5*(V\_C1\text{black}+V\_C1\text{white})$$

and by substituting in values above:

$$VSHBOT=(VRT-VX0-VSWING\_MAX\_SN)/2$$

Figure 21:
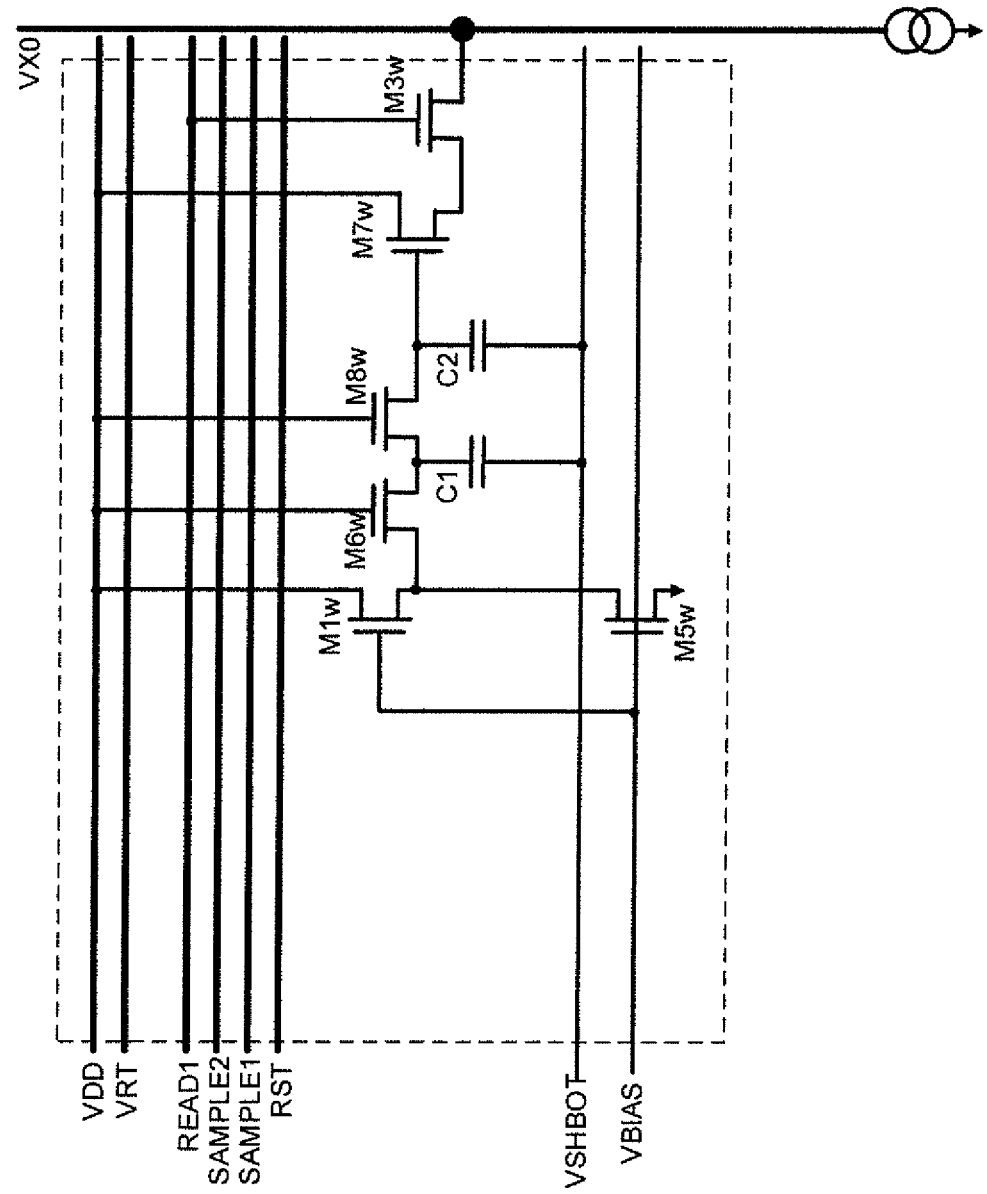
FIG. 21 is a schematic diagram of a pseudo pixel for white reference generation.

Reference is made to FIG. 21 which shows a pseudo pixel for white reference generation. In the above embodiment, V_C1 white is determined using the black pseudo pixel. However in some embodiments, a pseudo white pixel such as shown in FIG. 21 may also be provided to determine V_C1. This again would be used in conjunction with a pixel such as shown in FIG. 8. Those transistors in FIG. 21 which are equivalent to those of FIG. 8 are referenced by the same reference number but with the suffix w. As compared to the pixel of FIG. 8, the pseudo pixel of FIG. 22 either has no photodiode, transfer gate and reset transistor or they are disconnected. The sample switch transistors M6w and M8w are also turned by the voltage VOID.

After an imaging pixel has been exposed to light and the signal transferred, it will be a lower voltage than the reset voltage. However, there is no convenient voltage inside a pixel which will reflect this. One voltage is ground, but in practice this will not be reached by a real pixel. The next lowest voltage in the pixel will be the VBIAS voltage and so this is used to provide a low reference voltage.

Some embodiments which will now be described may allow for increased storage capacity density without needing to change the insulator (either thickness, type or dielectric constant). An increased storage capacity density will permit either smaller pixels (without loss of performance) or increased number of capacitors to be stored in similar sized pixels—increasing the functionality of the pixel (e.g. HDR CDS—high dynamic range correlated double sampling). For example, some embodiments may reduce the size of global shutter pixels without degrading performance. Some embodiments may improve storage density so that correlated double sampling noise reduction may be used for example on HDR images.

The transistors typically operate with a pinned photodiode structure and Correlated Double Sampling (CDS) to remove "kTC" noise associated with the reset operation. In Correlated Double Sampling, the output of the pixel is measured twice: once in a reset condition (in this case at "black level" when the only level change is resultant from noise) and once in a condition including the signal (which still includes the "black level" noise). The value measured from the signal condition is then subtracted from the reset condition so as to remove the "black level" noise offset. The double sampling operation also removes fixed noise sources such as variation in the threshold voltages of the source follower transistors.

In the above described embodiments, a Metal-Insulator-Metal (MIM) stack may be used, providing two plates of a capacitor. MIM capacitors are often used in designs where both plates of the capacitor are "floating" (i.e. not at either ground or power supply rail). In BSI GS pixels, it is acceptable to have one plate of the capacitors at ground (as in some previous embodiments). A MIM capacitor can be placed above the pixel's transistors and so enable the implementation of smaller pixels.

Figure 11A:
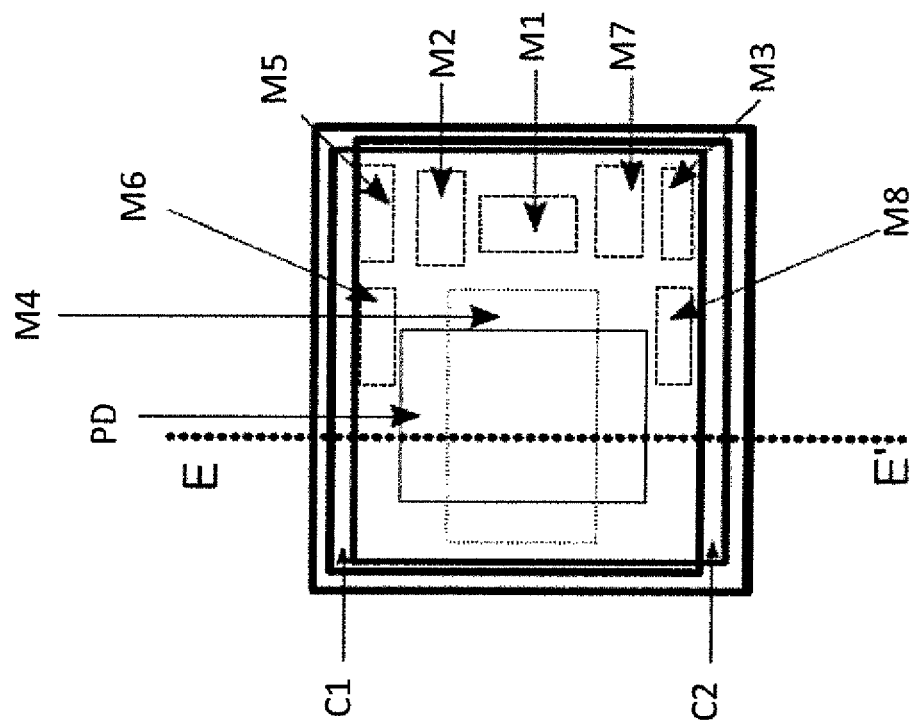
FIG. 11a is a plan view of another pixel embodiment with a dual insulator capacitor.
Figure 11B:
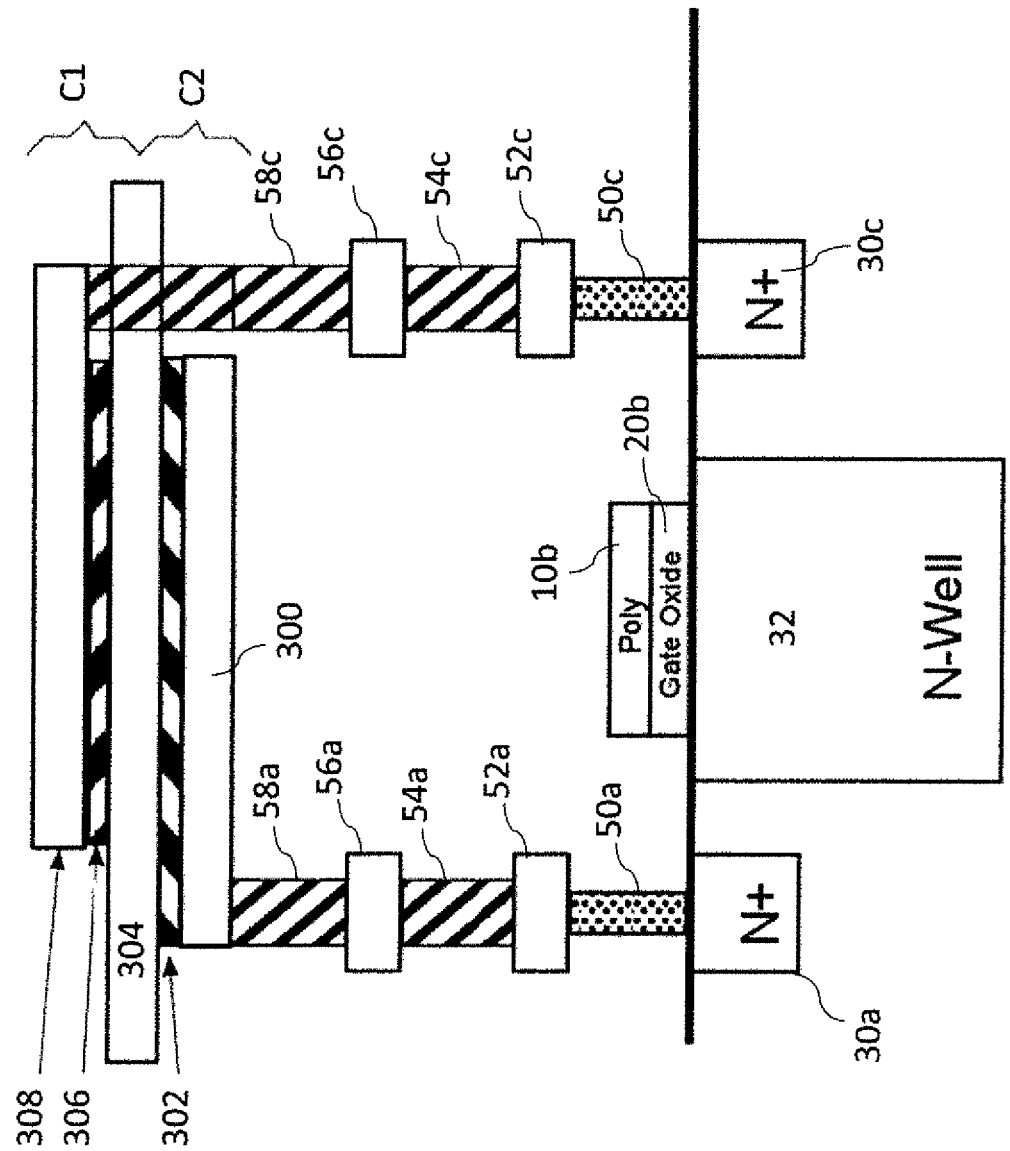
FIG. 11b is a cross section of the pixel of FIG. 11a taken along the line E-E'.

As discussed previously in relation to some embodiments, as one plate of the S/H capacitor is common to both storage capacitors C1 and C2 in each pixel, it is possible to use this commonality to implement the capacitor differently. In this regard, reference is made to FIGS. 11 $a$ and $b$. FIG. 11$a$ shows a plan view of a pixel with a dual insulator MIM capacitor and FIG. 11$b$ shows a cross section along line E-E' of FIG. 11$a$. Reference will be made first to FIG. 11$b$. The cross-section shown in this Figure is the generally the same as that shown in relation to FIG. 3$b$ other than the capacitors C1 and C2. The transistors are as described in relation to FIG. 12. In this arrangement, a first plate 300 of the second capacitor is provided which extends over the photodiode. An insulator 301 is provided over the first plate 302 and is of the same area as the first plate. A second metal plate 304 is provided over the insulator. This plate is shared in common with the first capacitor C1. In this embodiment, the first plate 300 is in contact with the second metal via 58$a$ and the not the second metal via 58$c$. An insulator 306 for the first capacitor is provided on the common plate 304. Finally, a second plate 308 is provided for the first capacitor C1 which also overlies the photodiode as well as the second capacitor. The second plate 308 is coupled to the second metal via 58$c$. Because of this the second metal via 58$c$ may have a greater vertical extent as compared to the second metal via associated with the second capacitor.

In some embodiments the second capacitor may instead overlie the first capacitor C1.

As can be seen from a comparison of the plan view of FIG. 3$a$ with FIG. 11$b$, in the embodiment of FIG. 11, both of the capacitors C1 and C2 occupy most of the area of the pixel with one capacitor (C1) being above the other capacitor (C2) with the photodiode below both capacitors. Note that for clarity of drawing, in FIG. 11$a$ the edges of capacitors C1 and C2 are shown as not aligned. Typically they will be substantially aligned (apart from the via to the lower layers of metal) as this increases the area available and so the capacitance is maximized. The transistors of the embodiment of FIG. 11$a$ may be arranged generally as described in relation to FIG. 3$a$ or in any other suitable arrangement.

The embodiment of FIG. 11 may be employed on suitable pixel such as an 8T (sequential storage) global shutter pixel or on a 10T (parallel storage) global shutter pixel. The operation of 8T pixel involves sharing charge between the two capacitors and for this to produce a voltage which is the average of the reset (C2) and signal (C1) voltages, the capacitances should be matched. As the capacitance is dependent on the thickness of the typically very thin dielectric insulator layers, there may be a mismatch of around ±10%. In contrast, the 10T pixel keeps the signal in the voltage domain and so does not need particularly well matched capacitance values. However, the transistor count is increased. Different pixel structures may suit different applications.

Figure 12:
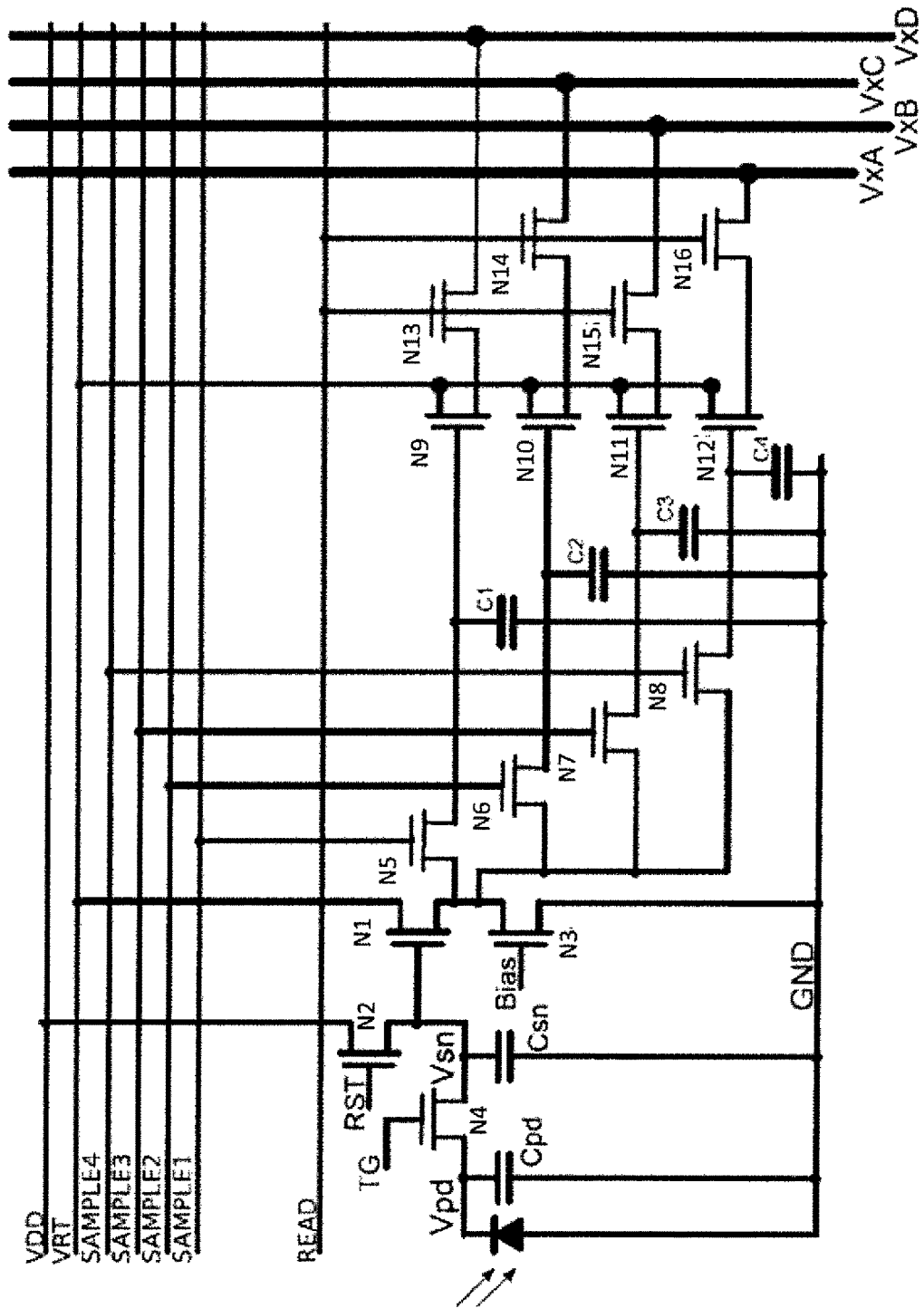
FIG. 12 is a schematic diagram of a global shutter pixel with four storage capacitors and four bit lines.

Some embodiments may increase the area available for storage capacitors, for example doubling the area. It is therefore practical to increase the capacitance of each S/H capacitor, for example doubling the capacitance. With HDR CDS, one pair of capacitors would be used to store a pair of reset signals from the floating diffusion node (Vsn) and the other pair of capacitors would be used to store a pair of illumination signals. FIG. 12 shows one example of such a circuit which has four storage capacitors C1, C2, C3, and C4 and four bit lines.

The photodiode PD is arranged between ground GND and the transfer gate N4. Parasitic capacitance Cpd of the photodiode is shown between a node between the photodiode and the transfer gate N4. Parasitic capacitance Csn of the sense node Vsn is shown between the sense node and ground. A reset transistor N2, diode source follower transistor N1 and bias transistor N3 are provided which operate as discussed previously, the bias transistor having its drain at ground.

Each of the capacitors C1, C2, C3 and C4 have a respective switch transistors N5, N6, N7 and N8 each of which a respective gate signal of SAMPLE1, SAMPLE2, SAMPLE 3 and SAMPLE4. Each of the switch transistors N5, N6, N7 and N8 have their source coupled to a node between the diode source follower transistor N1 and the bias transistor N3. Each of the switch transistors N5, N6, N7 and N8 have their drain coupled to the gate of a respective output source follower transistor N9, N10, N11 and N12. The capacitors are coupled between a respective node between the switch transistor and the gate of the respective output source follower transistor N9, N10, N11 and N12. Each of the sources of the output source follower transistors N9, N10, N11 and N12 is coupled to the reset voltage VRT and the drain is coupled to the source of a respective read transistor N13, N14, N15, and N16. The drains of the read transistors N13, N14, N15, and N16 are coupled to respective bit lines VxA, VxB, VxC and VxD. The gates of the read transistors N13, N14, N15, and N16 are coupled to the read signal READ.

Figure 13:
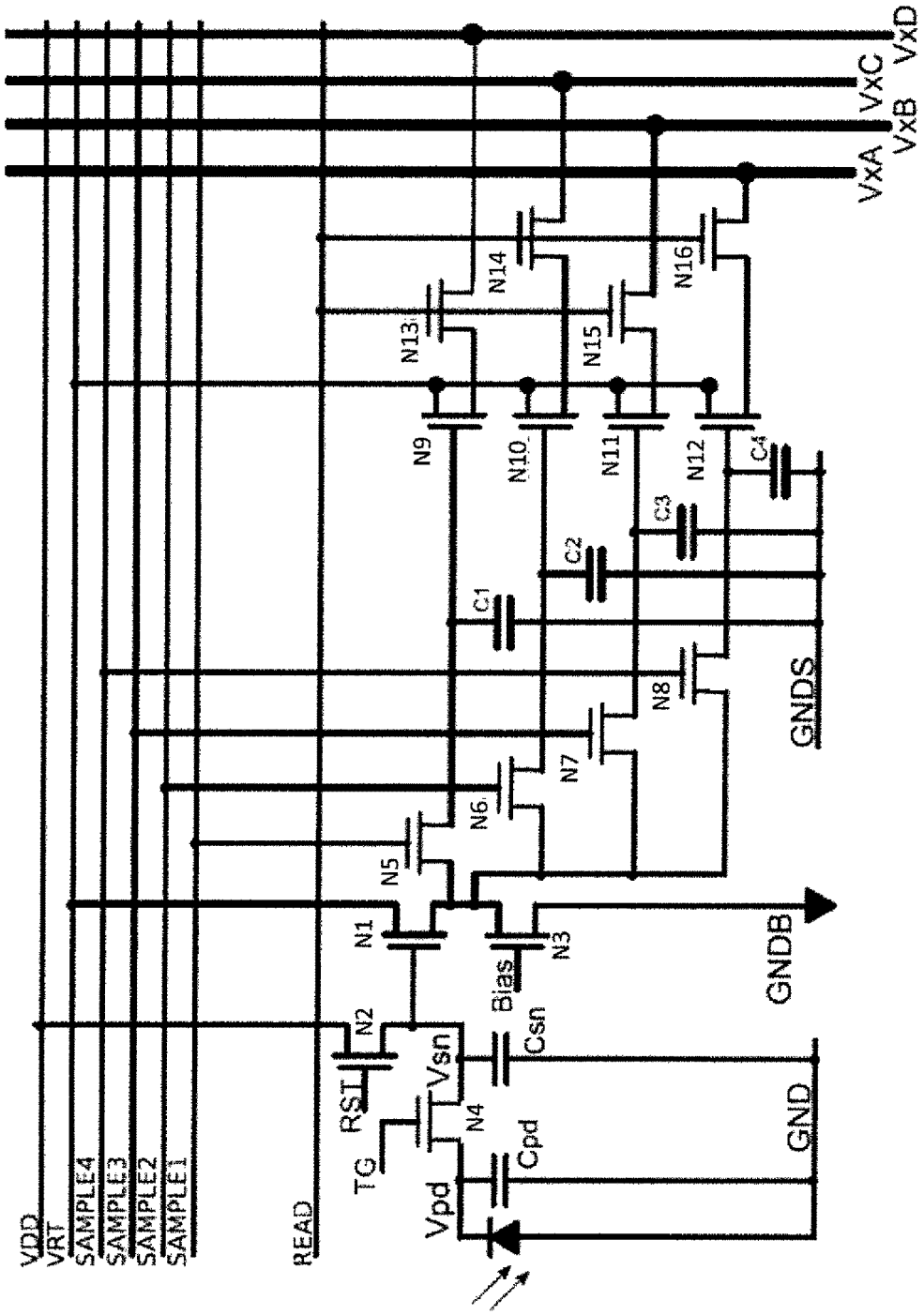
FIG. 13 is a schematic diagram of a global shutter pixel with four storage capacitors, four bit lines and three grounds.

Reference is made to FIG. 13 which shows a modification to the arrangement of FIG. 12. In this embodiment, the four capacitors C1, C2, C3 and C4 are coupled to a first ground GNDS, the bias transistor (the current mirror/load transistor) N3 is coupled to a second ground GNDB and pixel has a third ground GND. The photodiode and parasitic capacitors are coupled to ground. This may be advantageous as it allows the first GNDS to be at a different voltage to the second and third grounds. This means that the GNDS can be set such that the voltage across the sample hold capacitors C1-C4 is minimized. This may permit a thinner insulator to be used without the risk of breakdown of the insulator. A thinner insulator may produce higher capacitance values.

Figure 14:
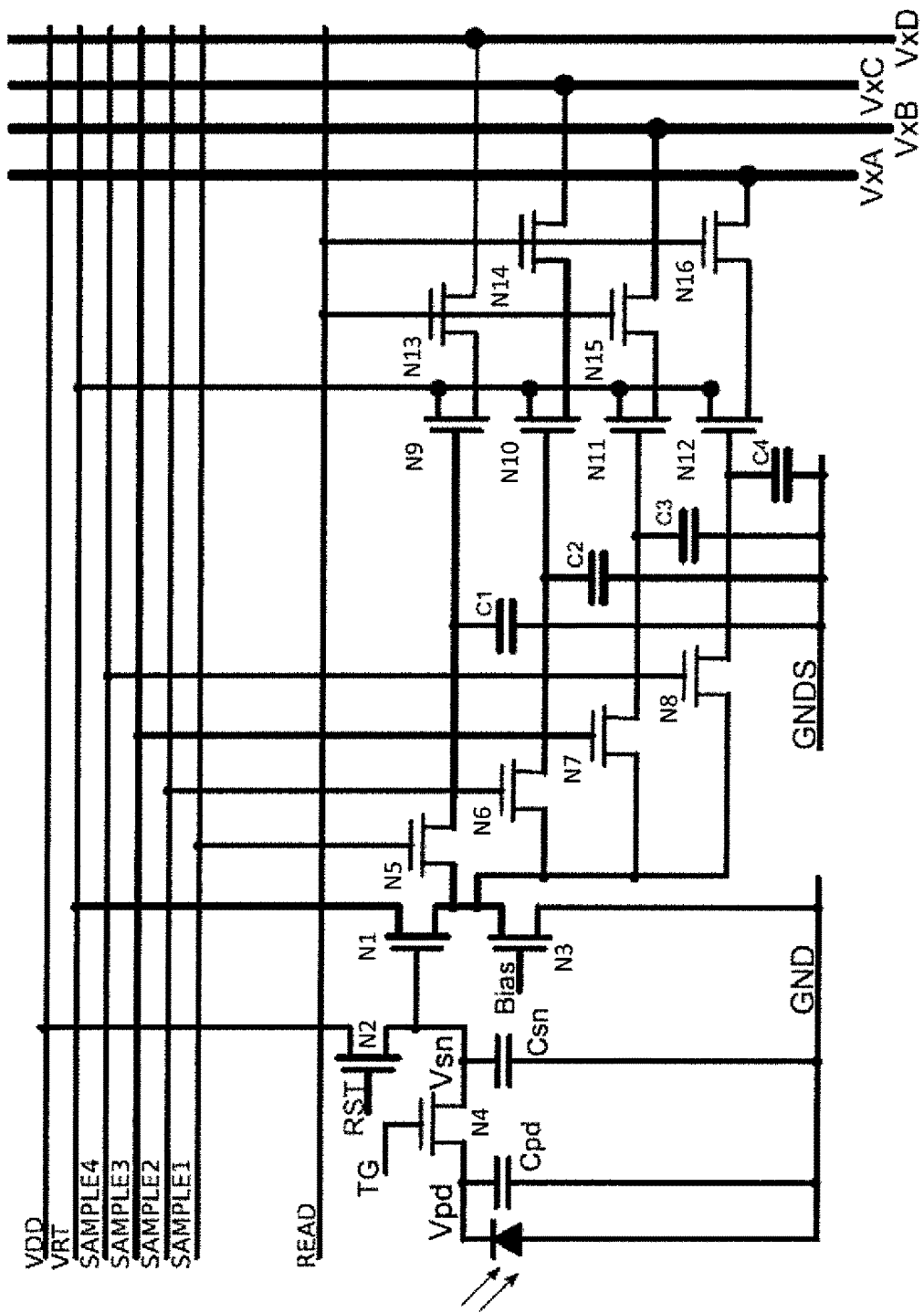
FIG. 14 is a schematic diagram of a global shutter pixel with four storage capacitors, four bit lines and two grounds.

Extra wiring is required for the embodiment of FIG. 13 as compared to FIG. 12 which as a single ground. In one modification to the embodiment of FIG. 13, which is shown in FIG. 14, the ground GNDB of the bias transistor N3 source is coupled to the photodiode ground GND. Alternatively the ground GNDB of the bias transistor N3 source may be coupled to the capacitor ground.

The embodiments shown in FIG. 11, FIG. 12 and FIG. 13 have four output signals (bit lines). Whilst this may be desirable in some embodiments, this may take extra wiring and may not be desirable in other embodiments. The embodiments shown in FIG. 11, FIG. 12 and FIG. 13 also have each output signal passing through a different source-follower transistor (N9-N12) and it may be necessary to compensate for the variations in offset (due to the manufacturing variation in threshold voltage) of these source-follower transistors.

Figure 15:
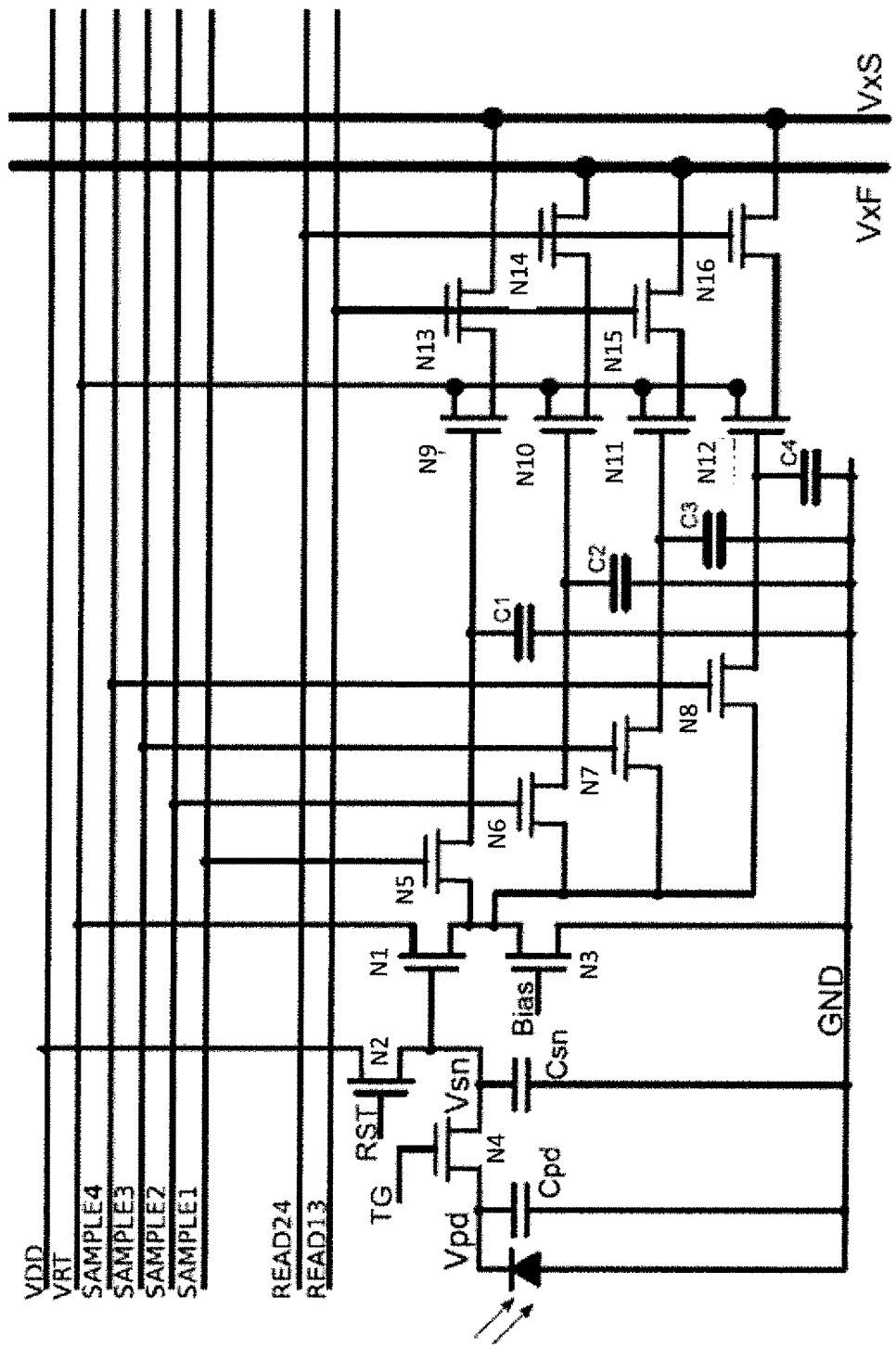
FIG. 15 is a schematic diagram of a global shutter pixel with four storage capacitors and dual bit lines.

In FIG. 15, four capacitors C1, C2, C3, and C4 are provide with dual bit lines. Thus two sample/hold or capacitor outputs share a single bit line, which saves two signals. The first and the fourth capacitors are read out via the one bit line VxS and the second and third capacitors are read out via the one bit line VxF. The single READ signal of FIG. 13 is replaced by two signals READ13, which causes the reading of the first and third capacitors and READ24, which causes the reading of the second and fourth capacitors. This saves one connection. However as all the voltages stored on the S/H capacitors C1 to C4 still pass through separate source-follower transistors, compensating for variations of the source follower transistors may need to be carried out. For example, after the signals have been readout of a pixel, control signals RST, SAMPLE1, SAMPLE2, SAMPLE 3 and SAMPLE 4 go high, generally at the same time. Bias is enabled so transistor M3 turns on and so VRT is output from the pixels. These four voltages are then used to compensate each of the four signals readout from the sampling phase of the pixel.

Figure 17A:
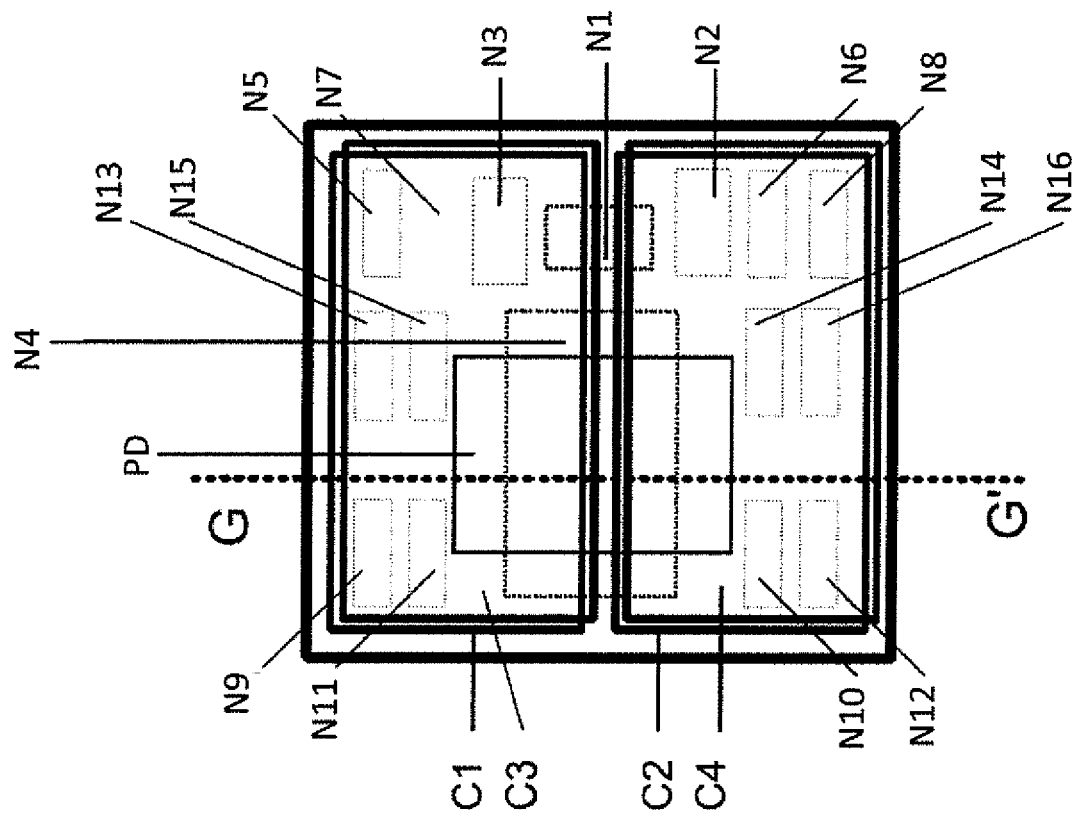
FIG. 17a is a plan view of the pixel of FIG. 15.
Figure 17B:
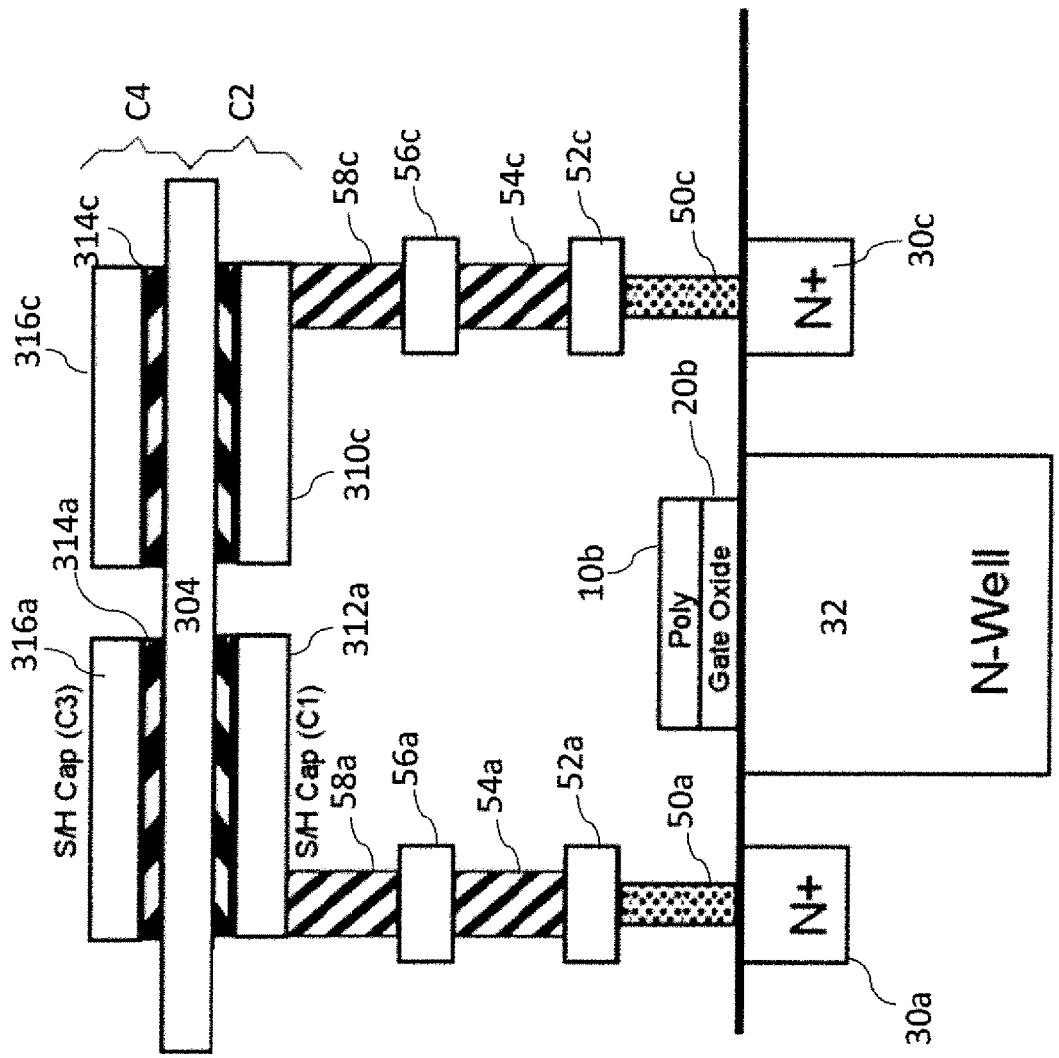
FIG. 17b is a cross section of the pixel of FIG. 17a taken along the line G-G'.

Reference is made to FIGS. 17a and 17b which show respectively a plan view and a cross-sectional view of the circuit of FIG. 15. Referring first to FIG. 17b, the first and third capacitors C1 and C3 are formed with the third capacitor C3 above the first capacitor C1. The fourth capacitor C4 is formed over the second capacitor C2. The four capacitors share a common plate. Thus the first capacitor has a first metal plate 310a in contact with the second via 58a. A dielectric layer 312a is provided with a second metal plate 304, which is the common plate. This common plate also provides one plate of the third capacitor C3 which is separated from a second metal plate 316a by a dielectric layer 314a. The second capacitor has a first metal plate 310c in contact with the second via 58c. A dielectric layer 312c is provided with a second metal plate 304, which is the common plate. This common plate also provides one plate of the fourth capacitor C4 which is separated from a second metal plate 316c by a dielectric layer 314c. It should be noted that the metal layers and dielectric layer of the first and second capacitors are in the same plane. Likewise the metal layers and dielectric layer of the third and four capacitors are in the same plane.

Reference is now made to FIG. 17a which shows a plan view where the first and third capacitors are one above the other and occupy around a half of the area of the pixel. Likewise the second and fourth capacitors are one above the other and also occupy around a half of the area of the pixel. The photodiode and transfer gate are arranged generally as shown in FIG. 3a. Along the first side of the pixel, underlying the first and third capacitors are the first and third output source follower transistors N9 and N11, the first and third read transistors N13 and N15 and the first and third switches N5 and N7. Likewise, on the third side of the pixel, opposite the first side and underlying the second and fourth capacitors C2 and C4 are arranged the following transistors: the second and fourth output source follower transistors N10 and N12, the second and fourth read transistors N14 and N16 and the second and fourth switches N6 and N8. Along the second side, which extends between the first and third sides are the bias transistor N3, the diode source follower transistor N1 and the reset transistor N2. The diode source follower transistor N1 underlies all of the capacitors in the central region of the pixel.

Note that for clarity of drawing, in FIG. 17a, the edges of capacitors C1 and C3 are shown as not aligned, similarly for C2 and C4. Typically they will be aligned (apart from the via to the lower layers of metal) as this increases the area available and so the capacitance may be maximized.

Figure 16:
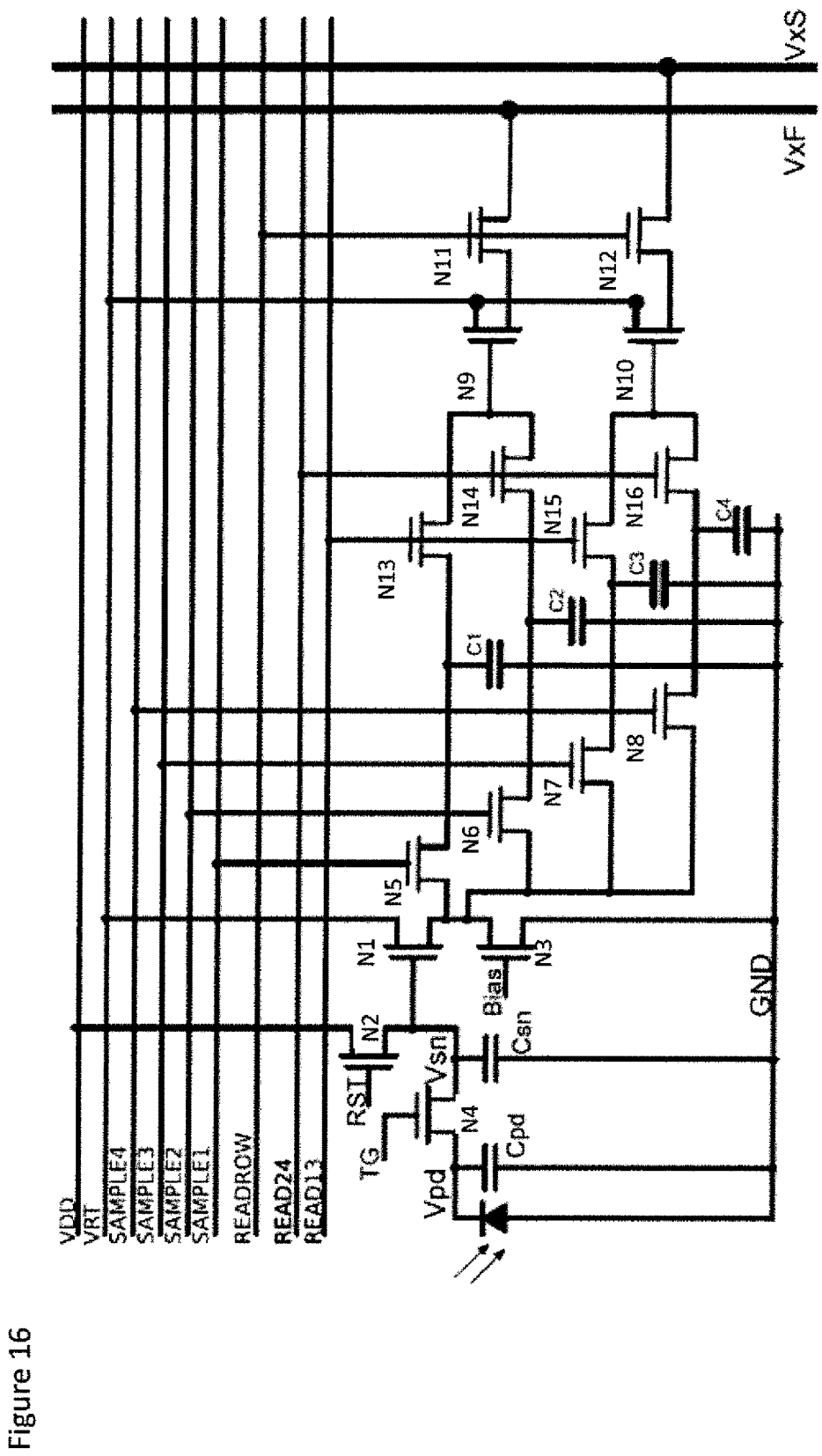
FIG. 16 is a schematic diagram of a global shutter pixel with four storage capacitors, two source follower transistors and two bit lines.

Reference is made to FIG. 16 which shows a modification to the arrangement of FIG. 15. Each capacitor is provided with a respective extra switch transistor N13, N14, N15 and N16 connected to the sample/hold capacitors on the opposite side of the capacitors to the respective first switches N5, N6, N7 and N8. There are however only two output transistors N9 and N10 and two output switches N11 and N12. Hence there are also 16 transistors in this pixel. The respective extra switches have their gate coupled to one of the read signals READ24 or READ13. The drains of the extra switches N13 and N14 associated with the first and second capacitors are coupled to the gate of the first output transistor N9 while the drains of the extra switches N15 and N16 are associated with the third and fourth capacitors are coupled to the gate of the second output transistor N10. The sources of the output transistors N9 and N10 are coupled to VRT and their drains are coupled to the source of the respective output switches N11 and N12. The gates of the first and second output switches N11 and N12 is coupled to the READROW signal. The drain of the first output switch N11 is coupled to the bit line VxF whilst the drain of the second output switch N12 is coupled to the bit line VxS.

It is possible to store the first reset signal on the first capacitor C1, the first illumination signal on the second capacitor C2, the second reset signal on the third capacitor C3 and the second illumination signal on the fourth capacitor C4. When this row is to be read out READROW will go high (turning on transistors N11 and N12), READ13 will go high (turning on transistors M13 and M15) and READ24 will go low (turning off transistors N14 and N16) and so the first reset signal will be output on VxF using the source follower transistor N9 and the second reset signal will be output on VXS using second source follower transistor N10. Typically the voltages on VxF and VxS will be stored outside of the array—either in the analogue domain on a sample/hold capacitor or converted into the digital domain using an ADC (not shown) and stored in digital memory.

Then the signal READ13 will go low and READ24 will go high and the first and second illumination signals which are stored on the second and fourth capacitors C2 and C4 respectively will be output onto VxF and VxS respectively via the source follower transistors N9 and N10 respectively.

Note that the first exposure's reset and illumination signals both go through the source follower transistor N9 and so will be offset by the threshold voltage (VT) of that transistor N9, i.e. a similar amount and so by subtracting the VxF voltage of the illumination signal from the VxF voltage of the reset signal, the offset due to the threshold voltage of N9 will be cancelled. Similarly for the offset of the source follower transistor N10 for the second reset and illumination signals. If the signals are stored in the analogue domain, this subtraction would preferably also be in the analogue domain and if the signal is in the digital domain, this subtraction is preferably performed in the digital domain.

In the embodiment of FIG. 16, the gates of the source follower transistors N9 and N10 are undefined (or at a previous voltage which leads to an error) before the sample/hold capacitors C1-C4 are connected. Hence, the voltage on their gates when capacitors are connected will not be exactly the same as the voltage stored on C1-C4 before the capacitor is connected. If the capacitance of the S/H is sufficiently large compared to the capacitance of the gate this may not be an issue. However in some embodiments, the gates of N9 and N10 are pre-charged to a defined voltage. This may be achieved by adding a transistor to each of source follower transistors N9 and N10 and a voltage reference and briefly enabling these pre-charge transistors before the sample/hold capacitors are connected.

Adding transistors and control signal and associated wiring will add to the size of each pixel and may not be appropriate in some applications. Instead, in some embodiments, the gate of source follower transistor N9 is pre-charged when the reset voltage is stored on the first capacitor C1 by enabling the signal READ13 when the pixel is sampling the reset voltage on the sense node SN. Similarly the gate of the second source follower transistor N10 is precharged when the reset voltage is stored on the third capacitor C3. This is when SAMPLE1 and/or SAMPLE3 is high.

Once the reset signals (of the first capacitor C1 and the third capacitor C3) have been readout, optionally the gates of the source follower transistors N9 and N10 may not be pre-charged before readout of the illumination signal. There may be some error as some of the charge stored on the second capacitor C2 (and the fourth capacitor C4) will be used to change the voltage on the gate of transistors N9 (and N10), but the reset voltage (i.e. the voltage on the source follower gate) will be reset and be substantially the same from frame to frame (i.e. independent of the signal and will not change even if there is a change from frame to frame in the illumination on the pixel).

Optionally, it is possible to pre-charge the gates of source follower transistors N9 and N10 before the signals stored on the second and fourth capacitors C2 and C4 are read out by keeping READ24 low, turning on READ13, SAMPLE1 SAMPLE3 and turning on RST (which turns on reset transistor N2) and enabling BIAS so the bias transistor N3 is functioning as a current mirror. Hence the gates of source follower transistors N9 and N10 are pre-charged as they are driven to Vsn −Vt of the transistor M1.

Once the transistor N9 and N10 gates are pre-charged, then READ13, SAMPLE1 and SAMPLE3 go low and READ24 goes high and the first and second illumination signals which are stored on capacitors C2 and C4 respectively are read out.

Figure 10:
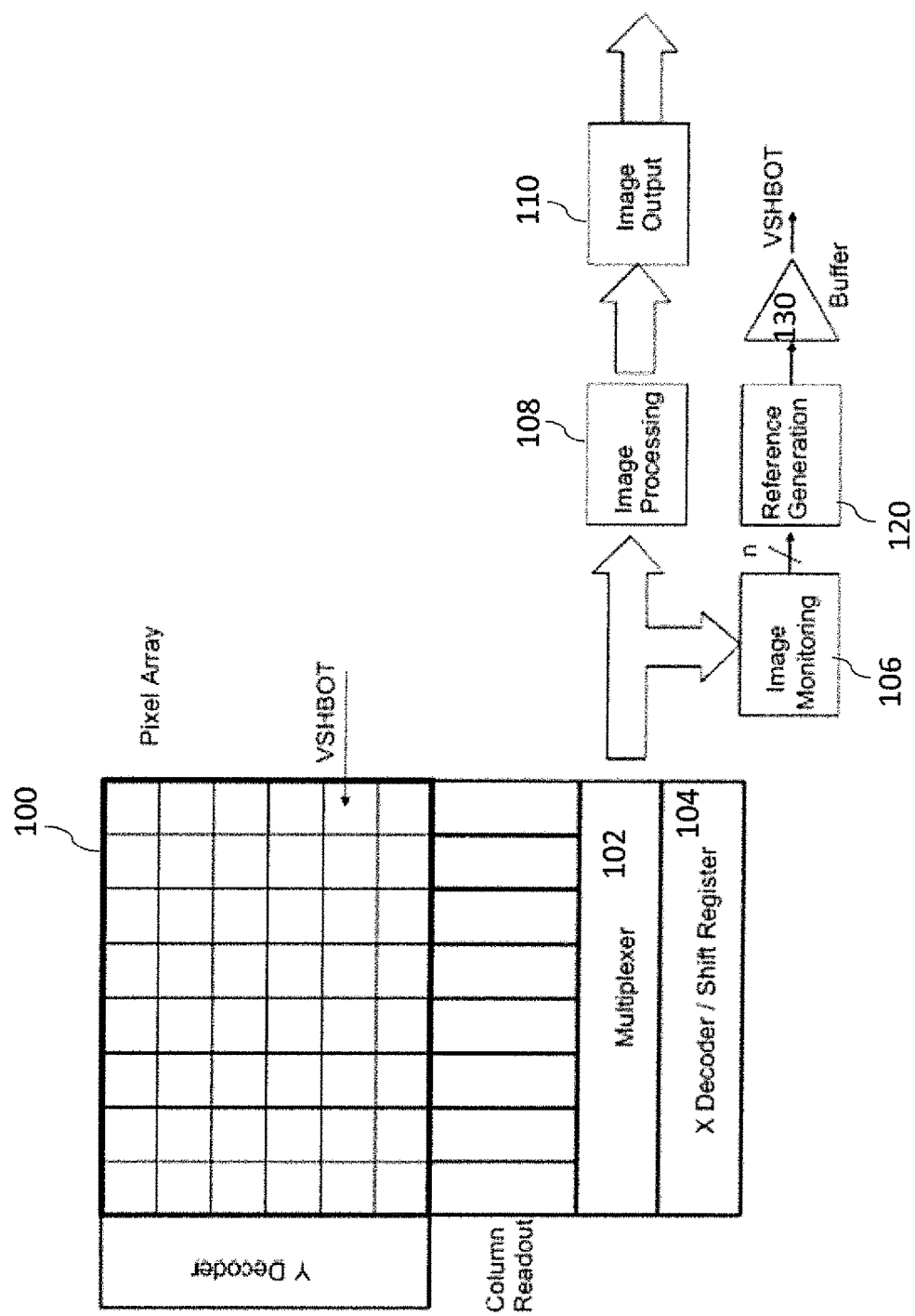
FIG. 10 is a system block diagram in which some embodiments may be provided.

Reference is made to FIG. 10 which shows the signals from the pixel array 100 which are read out by the column readout circuitry which may be analogue sample/hold or ADC. The columns are typically selected individually and the signals (analogue or digital) are multiplexed onto one or more busses (e.g. one for the intensity signal and one for the black or reset signal). In some systems, the signals would pass through an image processing block 108 (or "pipe") which would perform such functions as correlated double sampling (calculate the difference between the reset and intensity values for each pixel), defect correction (if a pixel is defective, use data interpolated from its neighbours), colour matrixing, image scaling etc. before through an image output block which would typically perform functions such as data compression (e.g. JPG encoding), apply checksum information and serializing it onto an output 110 such as an industry standard bus such as MDDI, MIPI or CSI.

In some embodiments, the image data and also preferably the data from the reset operation of the sensor, would be monitored by a monitoring function 106 and an appropriate value for the VSHBOT signal is calculated or determined. Preferably this would be output by an n-bit signal to a reference generation (e.g. ADC) block 120 which would be buffered in a buffer 130 before it is connected to the VSHBOT signals in the pixel array.

Figure 18A:
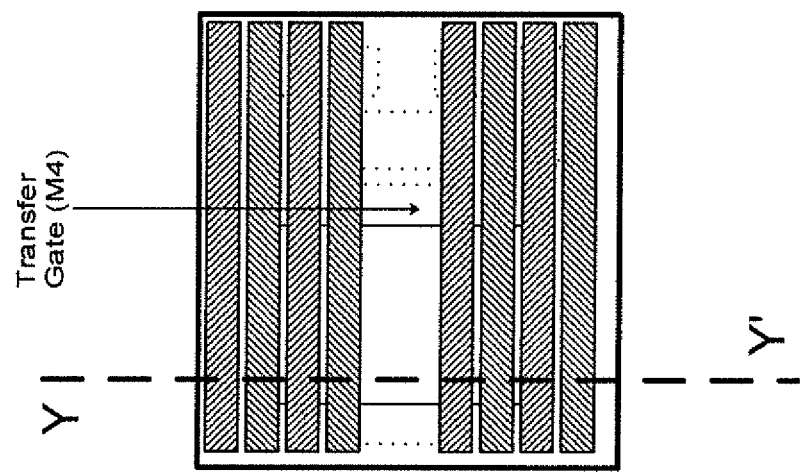
FIG. 18a is a plan view of a pixel with fringe or finger capacitors.
Figure 18B:
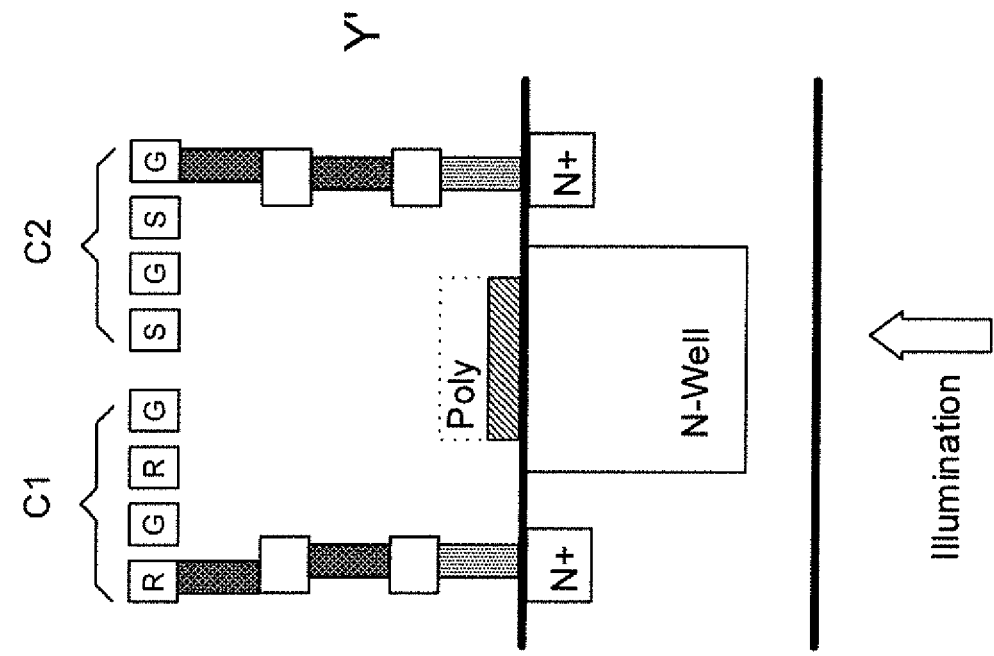
FIG. 18b is a cross section of the pixel of FIG. 18a along the line Y-Y'.

In alternative embodiments, the first and second capacitors may be fringe or finger capacitors as opposed to the plate capacitors described in some previous embodiments. Reference is made to FIG. 18a and FIG. 18b. The arrangement is generally the same as shown in FIGS. 3a and 3b apart from the capacitor structure. Accordingly only the capacitor structure will now be described.

The first capacitor C1 comprises a series of four parallel elongate conductors such as a metal arranged in a common plane, separated by an insulating material. The first and third elongate conductors are coupled to the reset voltage referenced R. The second and fourth elongate conductors are coupled to the ground voltage G. The first elongate conductors is coupled to the second via.

The second capacitor C2 comprises a series of four parallel elongate conductors of metal arranged in a common plane, separated by an insulating material. The first and third elongate conductors are coupled to the intensity voltage signal (the voltage generated in response to the photodiode being illuminated) and referenced S. The second and fourth elongate conductors are coupled to the ground voltage. The fourth elongate conductor is coupled to the second via.

The first and second capacitors may be arranged so that no elongate conductor coupled to the reset voltage R is next to a conductor coupled to the intensity voltage signal S. Rather it is preferred that there is that there is an elongate conductor coupled to ground between these conductors. This may avoid or reduce pixel-pixel cross talk. In the schematic view shown in FIG. 18a, there is a gap between the first and second capacitors. In some embodiments, the area of the pixel may be covered by evenly spaced elongate conductors providing the first and second capacitors without the large gap between the capacitors shown in the example of FIG. 18a. In preferred embodiments, the spacing between each of the conductors is the same.

The capacitors in the embodiment shown in FIGS. 18a and 18b are provided by the same metal layer.

Figure 19:
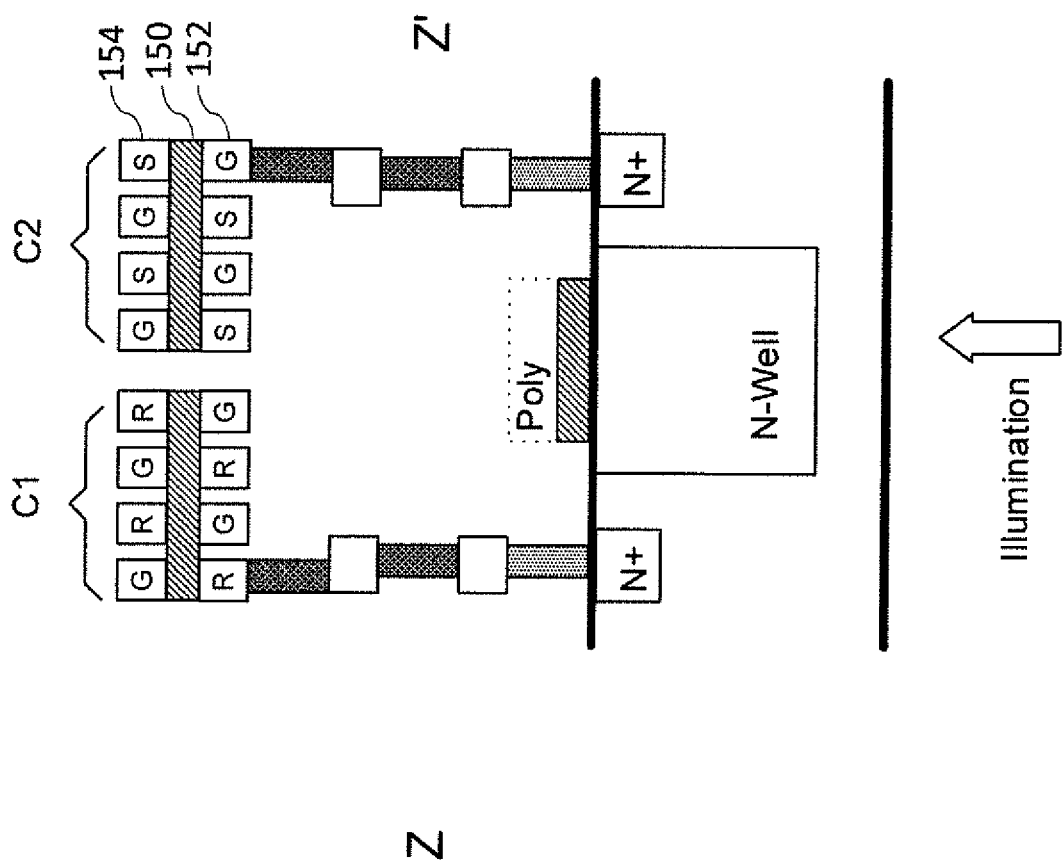
FIG. 19 is a cross section of a pixel with fringe or finger and metal-insulator-metal capacitors.

In one modification to the arrangement shown in FIGS. 18a and 18b, a fringe or finger capacitor (where the conductors are on the same metal layer) can be used in combination with plate capacitors (where the different conductors are on different metal layers). In this regard, reference is made to FIG. 19. An insulator layer 150 is provided on each of the capacitors shown in FIGS. 18a and 18b. These capacitors are provided by the metal layer referenced 152. A further metal layer 154 is provided which provides two further fringe or finger capacitors. The elongate conductors of the further metal layer 154 are aligned with those of first metal layer 152. However, the conductors at ground voltage G, for the first capacitor, are aligned with the conductors at the reset voltage R. Likewise for the second capacitor, the conductors at ground voltage G are aligned with the conductors at the intensity voltage S.

The above embodiments have been described in relation to global shutter pixels. Is should be appreciated that one or more capacitors such as described above may be used in rolling blade pixels. The capacitor or capacitors may have a different function when used with rolling blade pixels. For example, the capacitor or capacitors such as described previously may be provided to give extra capacitance to a rolling blade pixel to increase full-well.

Figure 22:
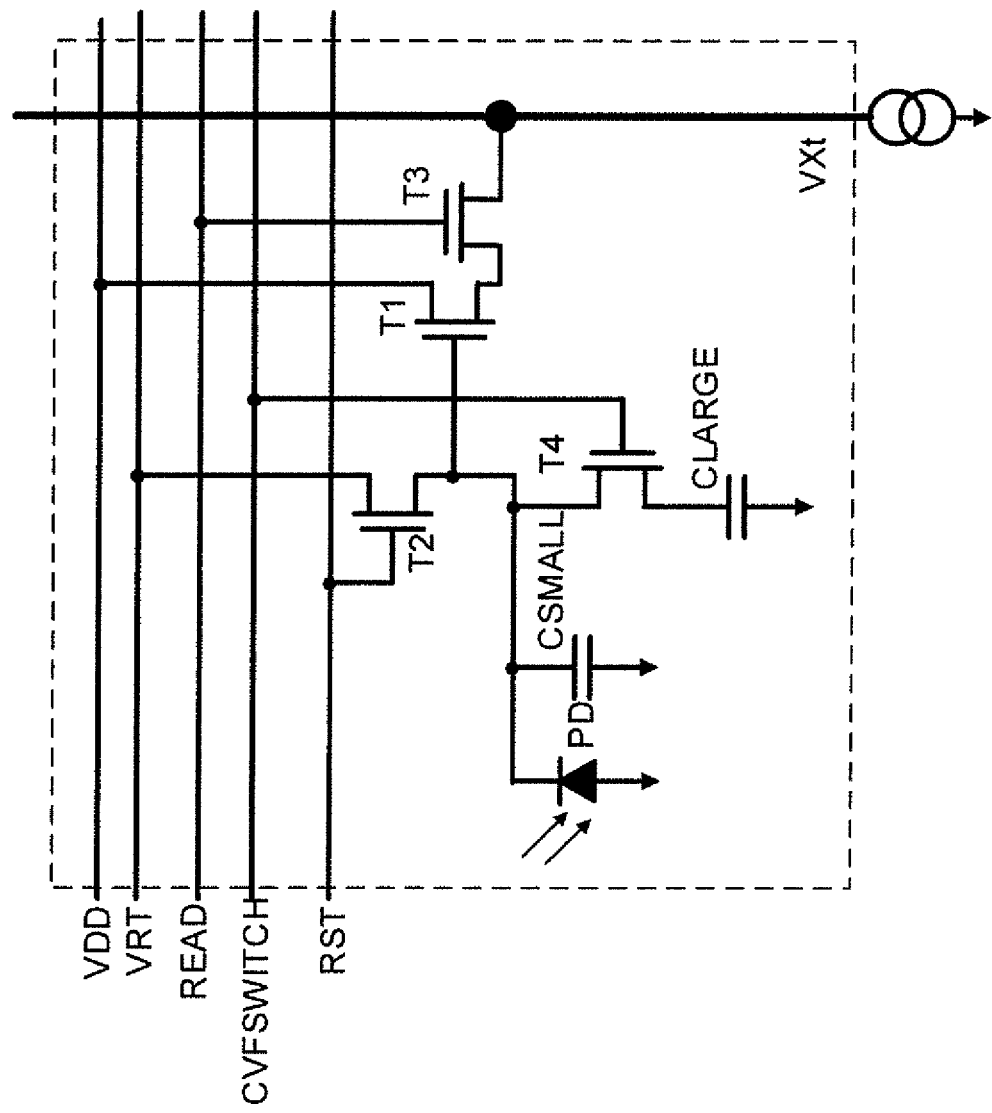
FIG. 22 is a schematic diagram of a three transistor rolling blade pixel of an embodiment.

Reference is made to FIG. 22 which shows an example of a rolling blade pixel using a capacitors such as previously described. The arrangement of FIG. 22 is a 3T pixel. The pixel comprises a photodiode PS, a source follower transistor T1, a reset transistor T2 and a read transistor T3. The reset transistor is controlled by a reset signal RST and the read transistor is controlled by a read signal READ. The source of the reset transistor T2 is coupled to voltage VRT while the source of the source follower transistor T1 is coupled to VDD.

The capacitor CSMALL represents the intrinsic capacitance of the photodiode PD. The voltage swing on the pixel is limited on the high end by VDD and at the low end by the current load. Calling this voltage swing VSWING3T, and the gain of the source follower transistor T1 to be GSF, then the voltage swing at the photodiode is VSWING/GSF. Hence the amount of charge that can be stored on the photodiode is CSMALL×VSWING/GSF By adding an extra capacitance CLARGE, the conversion gain of the pixel can be reduced and the charge capacity (full well) of the pixel increased, thereby increasing the maximum signal-noise ratio. This capacitor can be positioned and have the structure as described in any of the previous embodiments. In this embodiment, the amount of charge that can be stored is (CSMALL+CLARGE)×VSWING/GSF. The large capacitor CLARGE may be switchable using transistor T4 which is controlled by the signal CVF-SWITCH. The source of the transistor is coupled the small capacitor CSMALL and the drain to the large capacitor CLARGE.

Figure 23:
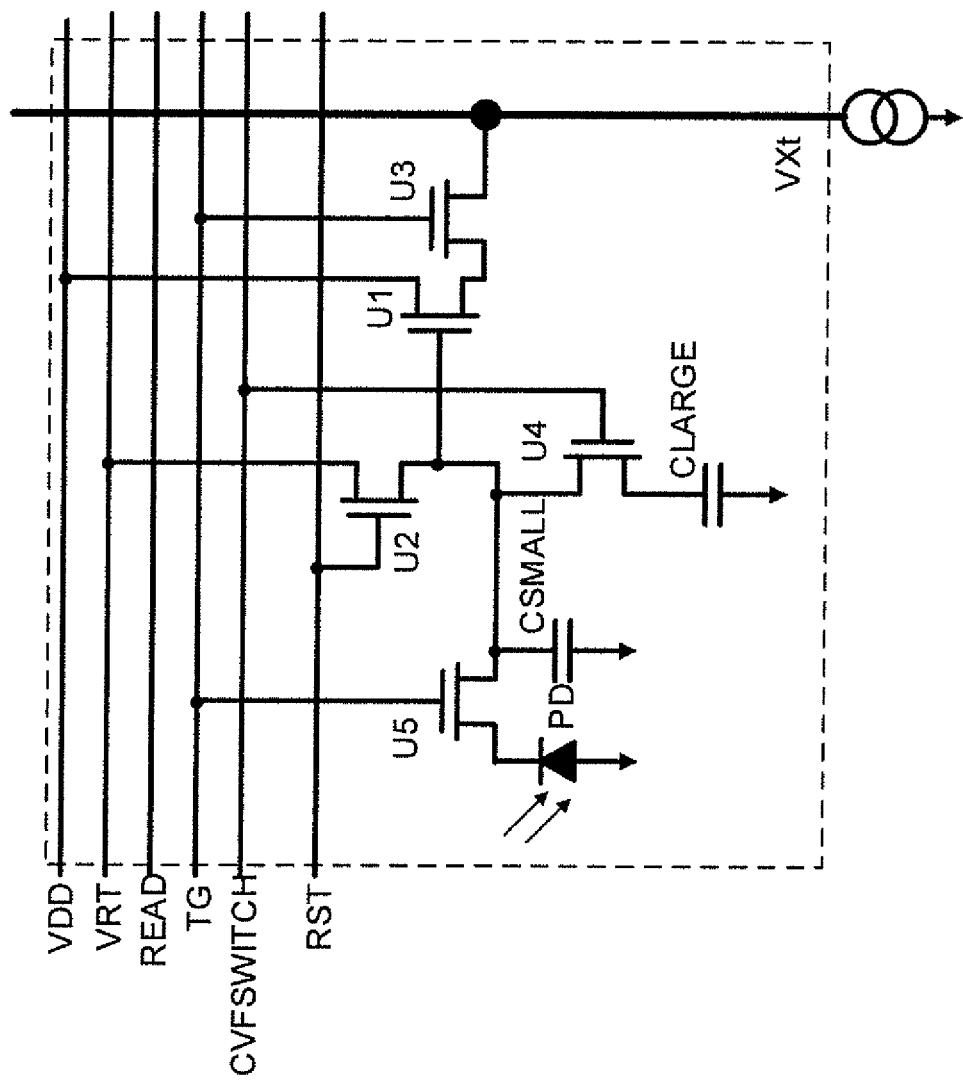
FIG. 23 is a schematic diagram of a four transistor rolling blade pixel of another embodiment.

FIG. 23 shows a 4T rolling blade pixel using a capacitor CLARGE such as previously described. This pixel comprises a photodiode FD, a source follower transistor U1, a reset transistor U2, read transistor U3 and a capacitor switching transistor U4, generally as described in relation to FIG. 22. A transfer gate transistor U5 is additionally provided which is controlled by a transfer gate signal TG. The extra capacitance CLARGE is added in parallel to the sense node CSMALL. This may increase the charge capability of the sense node. This may require the charge capability of the photodiode to be increased.

It should be appreciated that various embodiments have been described. It should be appreciated that the number of transistors used will depend on the requirements of the pixels and other numbers of transistors may be used in other embodiments.

Some embodiments may be provided in an electronic device. It should be appreciated that the device may be any suitable device. By way of example only and without limitation, that device may be a mobile telephone, smart phone, tablet, computer, camera or the like.

In the above reference has been made to particular conductivity types. However in other embodiments, the transistors may be p-type transistors. In some embodiments the implants may be P implants. In some embodiments, a mix of N-type and P-type conductivities may be used.

In the above described, various electrical paths have been described. However, it should be appreciated that this is by way of example only. One or more additional elements may be provided. One or more of the elements described may be omitted in some embodiments.

Various embodiments with different variations have been described here above. It should be noted that those skilled in the art may combine various elements of these various embodiments and variations. Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A pixel comprising:
   a photodiode configured to be sensitive to light; and
   a plurality of capacitors arranged on a side of the photodiode opposite from a side on which light impinges the photodiode, each of said capacitors comprising an electrode partially overlying a first portion of said photodiode and not overlying a second portion of said photodiode.

2. A pixel as claimed in claim 1, wherein said electrodes comprise respective first electrodes arranged side by side; and wherein each capacitor further comprises a second electrode overlying the first electrode.

3. A pixel as claimed in claim 1, wherein said plurality of capacitors share at least one of a plate and a dielectric.

4. A pixel as claimed in claim 1, wherein each capacitor comprises a plurality of metal layers.

5. A pixel as claimed in claim 1, wherein each capacitor comprises at least one of a metal-oxide-metal capacitor, a metal-intermetal dielectric metal capacitor and a metal-insulator-metal capacitor.

6. A pixel as claimed in claim 1, wherein each capacitor comprises a gate oxide capacitor.

7. A pixel as claimed in claim 6, wherein each gate oxide capacitor comprises a well in a same substrate as a well of the photodiode.

8. A pixel as claimed in claim 1, wherein said plurality of capacitors share at least one layer.

9. A pixel as claimed in claim 1, wherein each capacitor comprises a finger capacitor.

10. A pixel as claimed in claim 9, wherein each finger capacitor comprises a plurality of elongate conductors, the elongate conductors of a respective capacitor being equally spaced from each other.

11. A pixel as claimed in claim 1 configured in use, to be responsive to back side illumination.

12. A pixel as claimed in claim 1, wherein at least one of said capacitors provides a sample and hold function.

13. A pixel as claimed in claim 1, wherein at least one of said plurality of capacitors is configured to store charge from said photodiode.

14. A pixel as claimed in claim 1, wherein at least 80% of an area of the pixel is covered by said plurality of capacitors.

15. A pixel array comprising:
    a plurality of pixels, each pixel comprising
        a photodiode configured to be sensitive to light, and
        a plurality of capacitors arranged on a side of the photodiode opposite from a side on which light impinges the photodiode, each of said capacitors comprising an electrode partially overlying a first portion of said photodiode and not overlying a second portion of said photodiode.

16. A pixel array as claimed in claim 15, wherein said pixel array is one of a global shutter pixel array and a rolling blade pixel array.

17. A pixel array as claimed in claim 15, wherein at least two pixels are configured such that at least one capacitor of said at least two pixels share at least one of a common plate and a common dielectric therebetween.

18. A pixel array as claimed in claim 15, wherein each pixel comprises a first capacitor and a second capacitor, said first capacitor configured to store charge from said photodiode and second capacitor configured to receive said charge from said first capacitor and to provide an output to a read transistor, wherein said first capacitor of one pixel is arranged to be adjacent to a second capacitor of an adjacent pixel.

* * * * *